(12) United States Patent
Haneda

(10) Patent No.: US 11,209,272 B2
(45) Date of Patent: Dec. 28, 2021

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventor: Hideo Haneda, Matsumoto (JP)

(73) Assignee: Seiko Epson Corporation

(\*) Notice: Subject to any disclaimer, the term of this patent is extended or adjusted under 35 U.S.C. 154(b) by 375 days.

(21) Appl. No.: 16/361,318

(22) Filed: Mar. 22, 2019

(65) Prior Publication Data

US 2019/0293424 A1    Sep. 26, 2019

(30) Foreign Application Priority Data

Mar. 23, 2018    (JP) .............................. JP2018-055954

(51) Int. Cl.
| | |
|---|---|
| *G01C 19/5776* | (2012.01) |
| *G01C 19/56* | (2012.01) |
| *H01L 41/113* | (2006.01) |
| *H03F 3/45* | (2006.01) |
| *H03M 1/06* | (2006.01) |
| *H03M 1/08* | (2006.01) |

(52) U.S. Cl.
CPC ...... *G01C 19/5776* (2013.01); *H01L 41/1132* (2013.01); *H03F 3/45076* (2013.01); *H03F 3/45475* (2013.01); *H03M 1/0624* (2013.01); *H03M 1/08* (2013.01); *H03F 2200/129* (2013.01); *H03F 2203/45116* (2013.01); *H03F 2203/45512* (2013.01); *H03F 2203/45526* (2013.01)

(58) Field of Classification Search
CPC . G01C 19/56; G01C 19/5607; G01C 19/5776
See application file for complete search history.

(56) References Cited

U.S. PATENT DOCUMENTS

| | | | |
|---|---|---|---|
| 10,921,347 B2* | 2/2021 | Kuroda | ..................... H03L 7/06 |
| 2007/0261488 A1* | 11/2007 | Murashima | ........ G01C 19/5607 |
| | | | 73/504.04 |
| 2010/0071466 A1* | 3/2010 | Kanai | ..................... G01C 19/56 |
| | | | 73/504.02 |
| 2010/0259318 A1 | 10/2010 | Bien et al. | |
| 2012/0196555 A1* | 8/2012 | Igarashi | .................. H04B 1/30 |
| | | | 455/341 |

(Continued)

FOREIGN PATENT DOCUMENTS

| | | |
|---|---|---|
| JP | H06-109475 A | 4/1994 |
| JP | 2012-189610 A | 10/2012 |
| JP | 2012-198099 A | 10/2012 |

(Continued)

*Primary Examiner* — Herbert K Roberts
(74) *Attorney, Agent, or Firm* — Harness, Dickey & Pierce, P.L.C.

(57) ABSTRACT

A circuit device includes a detection signal terminal to which a detection signal from a vibrator is input, a digital signal terminal that performs at least one of an input and an output of a digital signal, a detection circuit, and a signal generation circuit that generates a noise reduction signal based on the digital signal. The detection circuit includes an amplification circuit that amplifies the detection signal. The amplification circuit performs addition processing of a signal obtained by amplifying the detection signal and the noise reduction signal.

11 Claims, 15 Drawing Sheets

(56) References Cited

U.S. PATENT DOCUMENTS

2015/0143903 A1    5/2015  Aoki
2016/0341762 A1*  11/2016  Waters .................. G01P 15/125

FOREIGN PATENT DOCUMENTS

| JP | 2012-523565 A | 10/2012 |
|----|---------------|---------|
| JP | 2015-102403 A | 6/2015 |
| JP | 2015-102404 A | 6/2015 |
| JP | 2015-230281 A | 12/2015 |
| WO | WO-2010-117615 A2 | 10/2010 |

* cited by examiner

FIG. 11
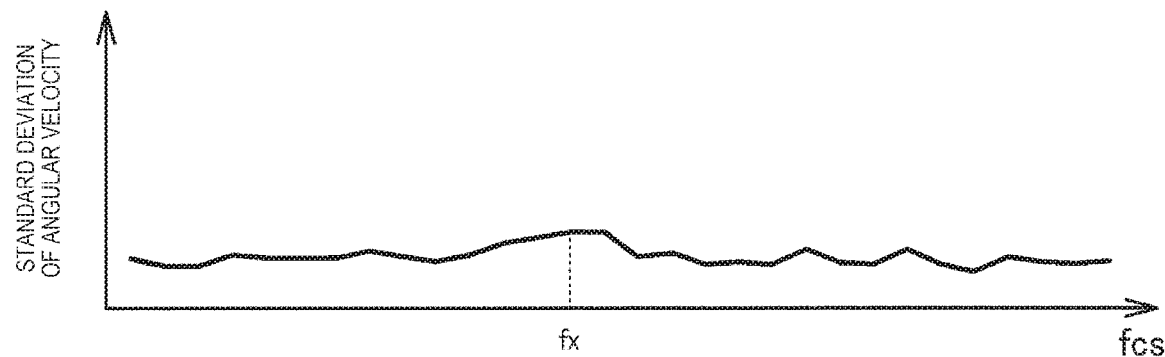
FIG. 12
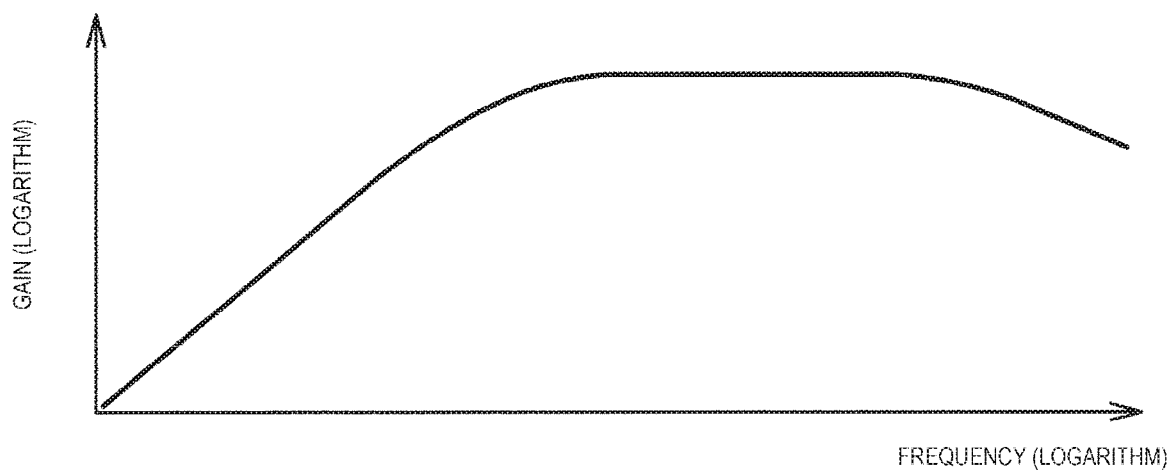
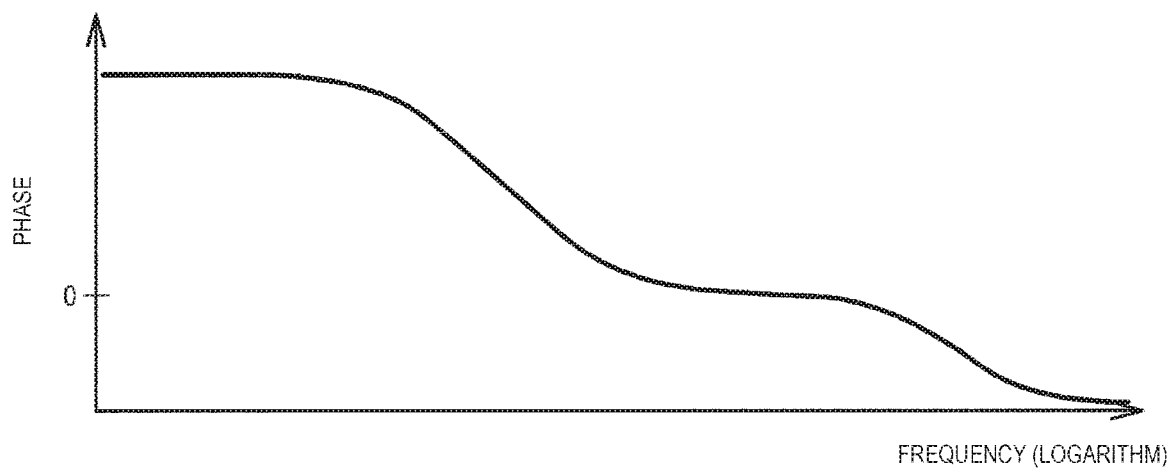

FIG. 13
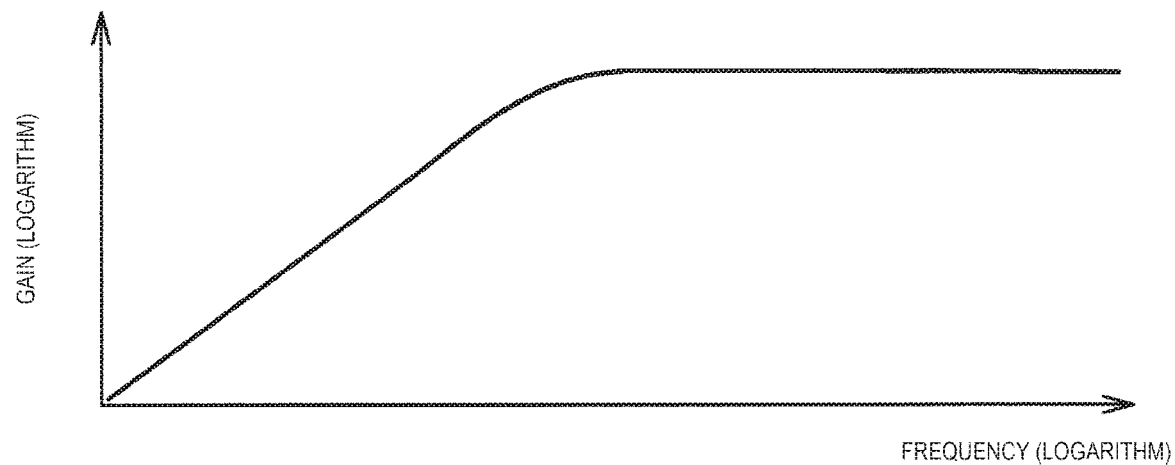
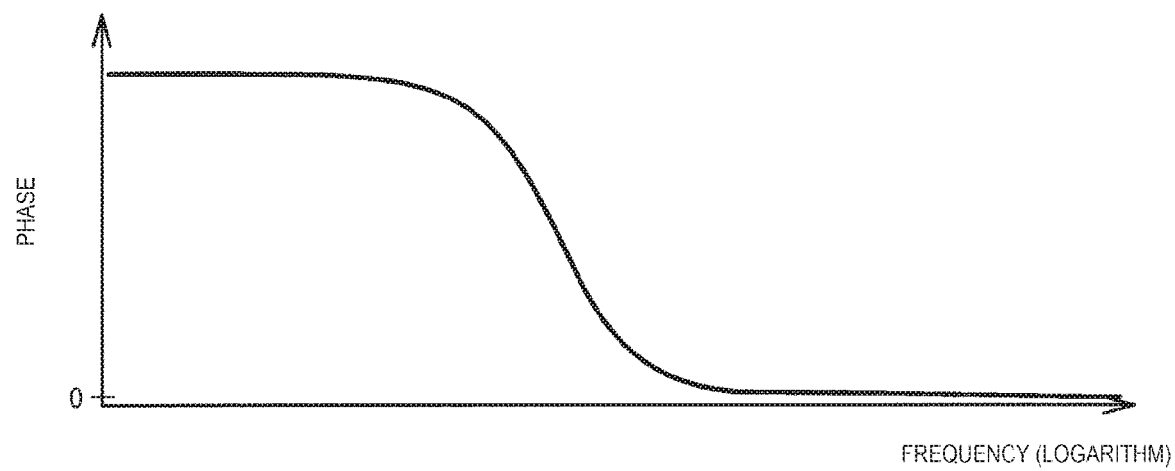

FIG. 14
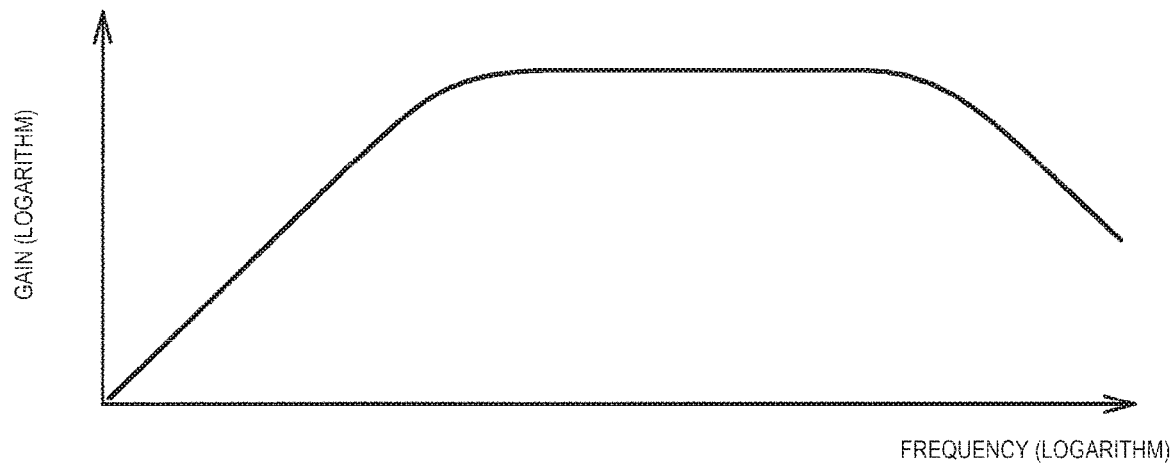
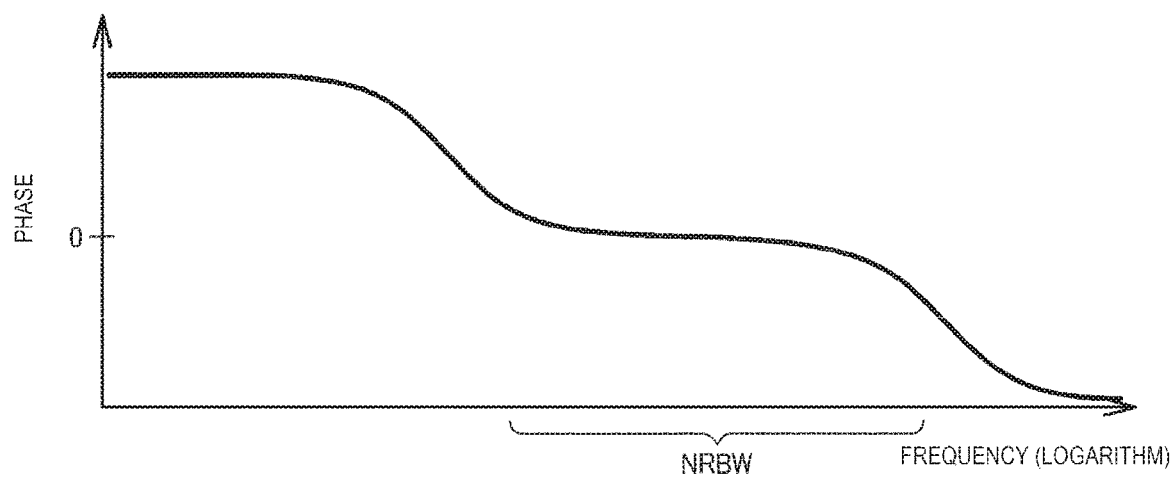
FIG. 15
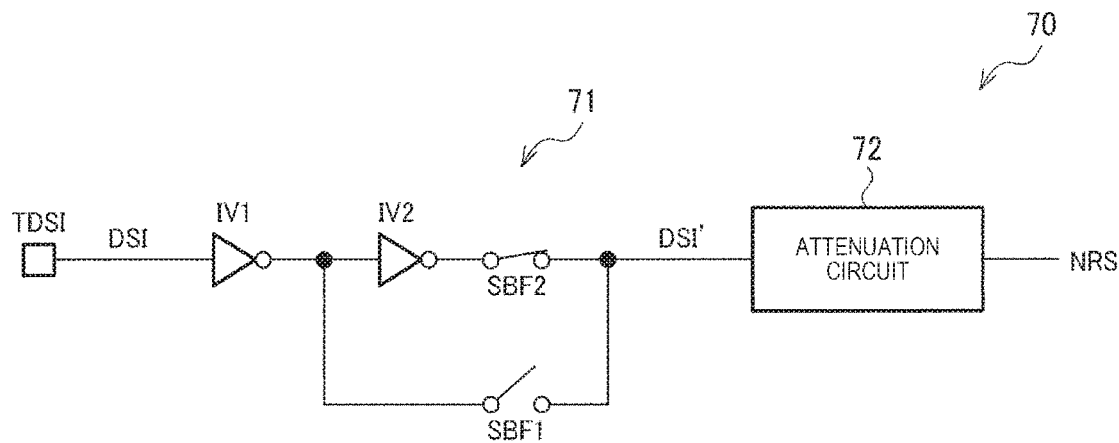

CIRCUIT DEVICE, PHYSICAL QUANTITY MEASUREMENT DEVICE, ELECTRONIC APPARATUS, AND VEHICLE

CROSS-REFERENCE

The entire disclosure of Japanese Patent Application No. 2018-055954, filed Mar. 23, 2018 is expressly incorporated by reference herein.

BACKGROUND

1. Technical Field

The present invention relates to a circuit device, a physical quantity measurement device, an electronic apparatus, and a vehicle.

2. Related Art

A physical quantity measurement device for detecting a physical quantity changed by an external factor is incorporated into an electronic apparatus such as a digital camera or a smartphone, or a vehicle such as a car or an airplane. For example, a gyro sensor that detects an angular velocity is used for so-called camera shake correction, posture control, GPS autonomous navigation, and the like.

In a case where the physical quantity measurement device outputs a physical quantity as digital data, the physical quantity measurement device includes an interface circuit for performing communication and a digital signal terminal for the interface circuit to input and output a digital signal. Electrostatic coupling through parasitic capacitance may occur between the digital signal terminal and an input terminal of a detection circuit for detecting the physical quantity. For example, parasitic capacitance is generated between various wires in a package of the physical quantity measurement device. In a case where a signal other than a detection signal such as a drive signal in addition to a digital signal is propagated to an input signal of the detection circuit through the electrostatic coupling, there is a risk of influencing a measurement accuracy of the physical quantity. The propagation of noise through the electrostatic coupling between various wires is called an electrostatic coupling leakage.

JP-A-2015-102403 and JP-A-2015-102404 disclose a technique in which connection terminals are separately arranged in a sensor package and a shielding film is disposed between wirings connected to the connection terminals, thereby, reducing the electrostatic coupling leakage in terms of hardware, as a technique of related art for reducing influence of the electrostatic coupling leakage of the digital signal. In addition, JP-A-2012-189610 discloses a gyro sensor that cancels electrostatic coupling leakage components due to parasitic capacitance between a wire for a drive signal and a wire for a detection signal which are different from a digital signal by performing differential amplification of the detection signal and cancels offset components other than electrostatic coupling leakage of an angular velocity signal by using offset components of the electrostatic coupling leakage.

In order to increase an accuracy of the gyro sensor, it is required to reduce an influence of the electrostatic coupling leakage of the digital signal, and a hardware countermeasure is limited due to manufacturing variation and the like. In JP-A-2012-189610, the offset components due to the drive signal are adjusted by signal processing, but JP-A-2012-189610 does not disclose or suggest a countermeasure against the electrostatic coupling leakage of the digital signal.

SUMMARY

An aspect of the invention relates to a circuit device including a detection signal terminal to which a detection signal from a vibrator is input, a digital signal terminal that performs at least one of an input and an output of a digital signal, a signal generation circuit that generates, based on the digital signal, a noise reduction signal for reducing noise of the detection signal, and a detection circuit includes an amplification circuit which amplifies the detection signal and performs addition processing of a signal which is obtained by amplifying the detection signal and the noise reduction signal, and a synchronization detection circuit which performs detection processing for an output signal of the amplification circuit, and the detection circuit detects a physical quantity signal based on an output signal of the synchronization detection circuit.

In the aspect of the invention, the amplification circuit may include a first amplifier circuit that amplifies the detection signal and outputs the amplified detection signal as a first output signal, and a second amplifier circuit that amplifies the first output signal and adds the noise reduction signal.

In the aspect of the invention, the detection signal may include a first detection signal and a second detection signal, the first amplifier circuit may amplify the first detection signal and the second detection signal and outputs a first signal and a second signal having a differential signal relationship as the first output signal, and the second amplifier circuit may amplify the first output signal and add the noise reduction signal to one of the first signal and the second signal.

In the aspect of the invention, the second amplifier circuit may include an operational amplifier, a first input capacitor that is provided between a node to which the first signal is input and a first input node of the operational amplifier, a first feedback capacitor that is provided between the first input node and a first output node of the operational amplifier, a second input capacitor that is provided between a node to which the second signal is input and a second input node of the operational amplifier, a second feedback capacitor that is provided between the second input node and a second output node of the operational amplifier, and a capacitor circuit that is provided between a node to which the noise reduction signal is input, and the first input node or the second input node.

In the aspect of the invention, the capacitor circuit may be a variable capacitance circuit whose capacitance value is variable.

In the aspect of the invention, the signal generation circuit may include an attenuation circuit that attenuates a signal level of the digital signal and outputs the attenuated signal as the noise reduction signal.

In the aspect of the invention, the attenuation circuit may include a first switch that is provided between a first node to which a power supply voltage is input and a second node, a variable capacitance circuit that is provided between the second node and a ground node, a second switch that is provided between the second node and a third node from which the noise reduction signal is output, a capacitor that is provided between the third node and the ground node, and a third switch that is provided between the third node and the ground node, and when the digital signal is at a first logic level, the first switch and the third switch may be turned on and the second switch may be turned off, and when the digital signal is at a second logic level, the first switch and the third switch may be turned off and the second switch may be turned on.

In the aspect of the invention, the attenuation circuit may be a resistance circuit in which a signal level of the digital signal is divided by a resistance voltage division and a voltage division ratio of the resistance voltage division is variable.

In the aspect of the invention, the signal generation circuit may include a buffer circuit that buffers the digital signal and outputs the buffered digital signal to the attenuation circuit, and the buffer circuit may be capable of switching between a first mode for outputting an inverted signal of the digital signal and a second mode for outputting a non-inverted signal of the digital signal.

In the aspect of the invention, the second amplifier circuit may include an operational amplifier, a first input capacitor that is provided between a node to which the first signal is input and a first input node of the operational amplifier, a first feedback capacitor that is provided between the first input node and a first output node of the operational amplifier, a second input capacitor that is provided between a node to which the second signal is input and a second input node of the operational amplifier, a second feedback capacitor that is provided between the second input node and a second output node of the operational amplifier, a first capacitor and a first capacitor connection switch that are provided in series between a node to which the noise reduction signal is input and the first input node, and a second capacitor and a second capacitor connection switch that are provided in series between the node to which the noise reduction signal is input and the second input node.

Another aspect of the invention relates to a circuit device including a detection signal terminal to which a detection signal from a vibrator is input, first to kth communication signal terminals that perform at least one of an input and an output of first to kth communication signals, k being an integer greater than or equal to 2, an interface circuit that performs interface processing, based on the first to kth communication signals, a signal generation circuit that generates, based on the first to kth communication signals, a noise reduction signal for reducing noise of the detection signal, and a detection circuit includes an amplification circuit which amplifies the detection signal and may perform addition processing of a signal which is obtained by amplifying the detection signal and the noise reduction signal, and a synchronization detection circuit which performs detection processing for an output signal of the amplification circuit, and the detection circuit detects a physical quantity signal based on an output signal of the synchronization detection circuit.

In the another aspect of the invention, the detection circuit may include a low pass filter that performs low pass filter processing of an output signal of the synchronization detection circuit, and an A/D conversion circuit that performs an A/D conversion of an output signal of the low pass filter, and the interface circuit may output physical quantity data based on A/D conversion data of the A/D conversion circuit during the interface processing.

Still another aspect of the invention relates to a physical quantity measurement device including the circuit device according to any one of the aspects described above, and the vibrator.

Still another aspect of the invention relates to an electronic apparatus including the circuit device according to any one of the aspects described above.

Still another aspect of the invention relates to a vehicle including the circuit device according to any one of the aspects described above.

BRIEF DESCRIPTION OF THE DRAWINGS

The invention will be described with reference to the accompanying drawings, wherein like numbers reference like elements.

FIG. 11 illustrates an example of measurement results in a case where the digital interference reduction method according to the present embodiment is used.

FIG. 12 illustrates a frequency characteristic example of a transfer function of a signal path for generating digital interference.

FIG. 13 illustrates a frequency characteristic example of the transfer function of the signal path for canceling the digital interference.

FIG. 14 illustrates a frequency characteristic example of a ratio between the transfer functions.

FIG. 15 illustrates a detailed second configuration example of the signal generation circuit.

DESCRIPTION OF EXEMPLARY EMBODIMENTS

Hereinafter, preferred embodiments of the invention will be described in detail. Embodiments which will be described below do not unduly limit contents of the invention described in the appended claims, and all the configurations described in the embodiment are not indispensable as means for solving the invention.

For example, in the following description, a case where a gyro sensor that performs a synchronization detection for a detection signal of a vibration element to extract an angular velocity signal reduces influence of an electrostatic coupling leakage of the digital signal on the angular velocity signal will be described as an example. However, an object to which the invention is applied is not limited to the gyro sensor, and the invention can also be applied to a case where a physical quantity measurement device that performs a synchronization detection for a detection signal of another physical quantity transducer to extract a physical quantity signal reduces the influence of the electrostatic coupling leakage of the digital signal on a physical quantity signal.

1. Circuit Device

Figure 1:
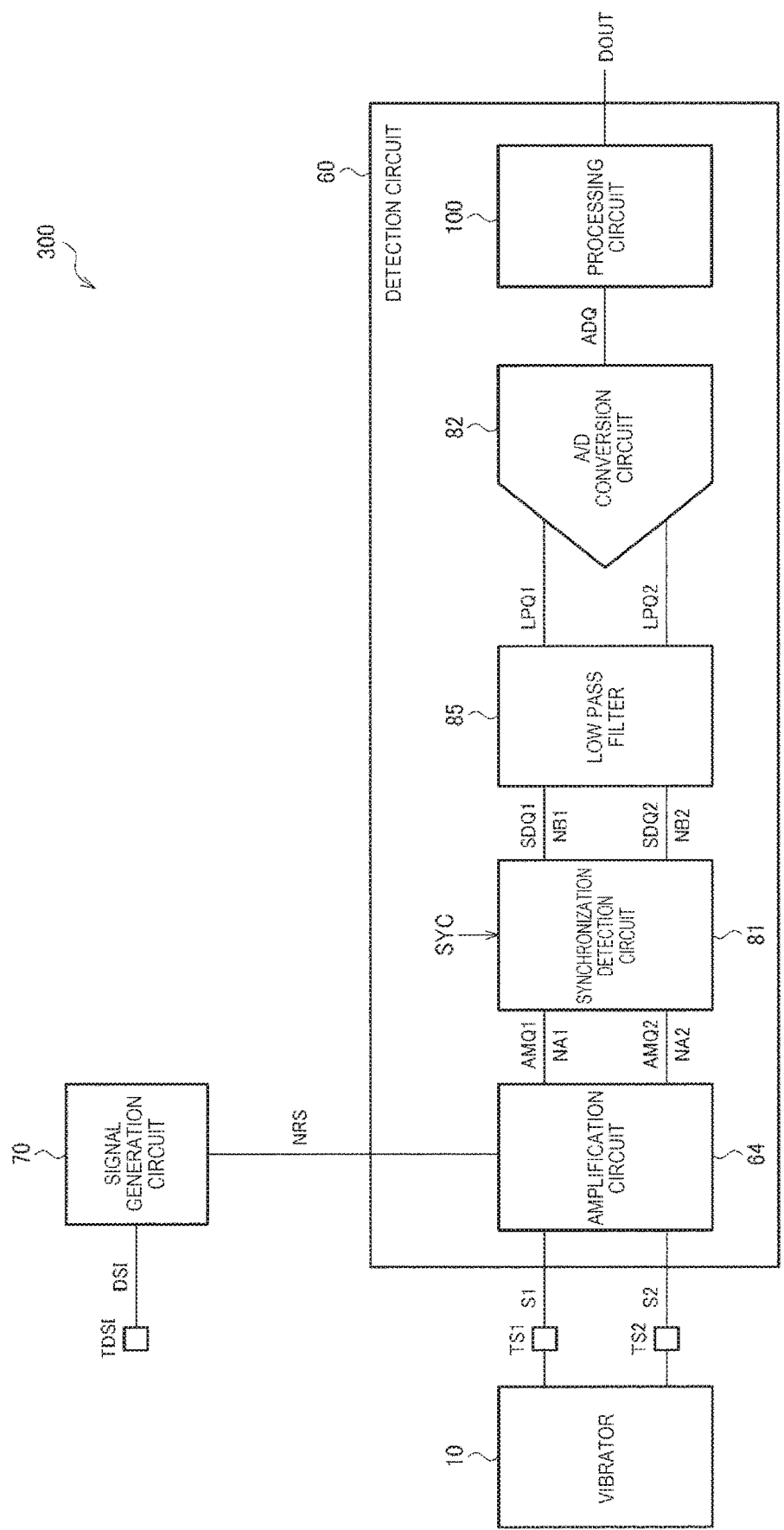
FIG. 1 illustrates a first configuration example of a circuit device.

FIG. 1 illustrates a first configuration example of a circuit device 300. The circuit device 300 includes a detection circuit 60, a signal generation circuit 70, detection signal terminals TS1 and TS2, and a digital signal terminal TDSI. TS1 is also referred to as a first detection signal terminal, and TS2 is also referred to as a second detection signal terminal. In addition, the circuit device 300 is also referred to as a detection device. The circuit device 300 is, for example, an integrated circuit device, and the circuit device 300 and the vibrator 10 are contained in a package, and thereby, a gyro sensor is configured. The gyro sensor is a physical quantity measurement device in a broad sense.

The vibrator 10 is a physical quantity transducer that converts an angular velocity of a detection axis into an electrical signal. That is, a Coriolis force acts on the vibrator 10 due to rotational components of the detection axis during rotation of the vibrator 10, the vibrator 10 detects the Coriolis force and outputs a signal corresponding to the Coriolis force. The vibrator 10 is, for example, a piezoelectric vibrator. For example, the vibrator 10 is a quartz crystal vibrator of a double T-shape, a T-shape, or a tuning fork type, or the like. A micro electro mechanical systems (MEMS) vibrator or the like as a silicon vibrator formed by using a silicon substrate may be adopted as the vibrator 10. The vibrator 10 is also referred to as an angular velocity detection element, an angular velocity transducer, or a gyro sensor element.

The detection signal terminals TS1 and TS2 are connected to the vibrator 10 and receive detection signals S1 and S2 from the vibrator 10. The detection signal terminals TS1 and TS2 are, for example, pads of a semiconductor chip. The detection signals S1, S2 configure differential signals, S1 is also called a first detection signal, and S2 is also called a second detection signal. In a case where the vibrator 10 is a piezoelectric vibrator, the detection signals S1 and S2 are electric charge signals.

The detection circuit 60 detects a physical quantity signal corresponding to a physical quantity, based on the detection signals S1 and S2. A signal value of the physical quantity signal indicates a physical quantity detected by the physical quantity transducer. That is, the physical quantity signal is an angular velocity signal indicating an angular velocity detected by the vibrator 10. In FIG. 1, the physical quantity signal is a digital signal of angular velocity data DOUT.

The detection circuit 60 includes an amplification circuit 64 that amplifies the detection signals S1 and S2 and a synchronization detection circuit 81 that performs detection processing for output signals AMQ1 and AMQ2 of the amplification circuit 64. The detection circuit 60 detects the angular velocity signal, based on output signals SDQ1 and SDQ2 of the synchronization detection circuit 81. Specifically, the detection circuit 60 further includes a low pass filter 85, an A/D conversion circuit 82, and a processing circuit 100.

The amplification circuit 64 performs a charge voltage conversion for the detection signals S1 and S2 which are electric charge signals, performs a differential signal amplification, gain adjustment or the like for the signal obtained by performing the charge voltage conversion, and outputs differential output signals AMQ1 and AMQ2.

The synchronization detection circuit 81 performs a synchronization detection for the output signals AMQ1 and AMQ2, based on a synchronization signal SYC synchronized with a drive signal of the vibrator 10, and outputs differential output signals SDQ1 and SDQ2. The synchronization signal SYC is a signal of a rectangular wave and is supplied from, for example, a synchronization signal output circuit 52 illustrated in FIG. 18. The detection signals S1 and S2 oscillate at a drive frequency, and an amplitude thereof represents the angular velocity. By synchronization detection, a signal oscillating at the drive frequency is detected as a signal close to DC, and the signal close to the DC becomes a signal corresponding to the angular velocity.

The synchronization detection circuit 81 includes a first detection switch provided between a node NA1 to which the signal AMQ1 is input and a node NB1 from which the signal SDQ1 is output, and a second detection switch provided between a node NA2 to which the signal AMQ2 is input and a node NB2 from which the signal SDQ2 is output. The synchronization detection circuit 81 includes a third detection switch provided between the node NA1 and the node NB2 and a fourth detection switch provided between the node NA2 and the node NB1. The first to fourth detection switches are configured by, for example, transistors. A first period in which the first and second detection switches are turned on and the third and fourth detection switches are turned off, and a second period in which the first and second detection switches are turned off and the third and fourth detection switches are turned on are alternately switched by the synchronization signal SYC.

The low pass filter 85 performs low pass filter processing for the output signals SDQ1 and SDQ2 of the synchronization detection circuit 81, and outputs differential output signals LPQ1, LPQ2. The low pass filter 85 is a differential passive low pass filter configured with, for example, a resistor and a capacitor.

The A/D conversion circuit 82 performs an A/D conversion for the output signals LPQ1 and LPQ2 of the low pass filter 85, and outputs A/D conversion data ADQ. The A/D conversion method can employ, for example, a successive approximation type, but is not limited thereto, and may employ a flash type, a pipeline type, a double integral type or the like.

The processing circuit 100 performs digital filter processing and digital correction processing for the A/D conversion data ADQ, and outputs the processed data as the angular velocity data DOUT. The digital filter processing is low pass filter processing of extracting the angular velocity signal in a band below a cutoff frequency. The digital correction processing is, for example, zero point correction processing, sensitivity correction processing, or the like. The zero point correction process is processing of correcting offset components of the angular velocity signal. The sensitivity correction processing is processing of correcting sensitivity characteristics of the angular velocity signal for an angular velocity input to the vibrator 10. The processing circuit 100 is configured by a logic circuit. The processing circuit 100 is, for example, a digital signal processor (DSP), and performs each type of the above-described processing in a time division manner.

The digital signal terminal TDSI is a terminal for performing at least one of input and output of a digital signal DSI. The digital signal DSI is a communication signal for the circuit device 300 to communicate with an external device. For example, the circuit device 300 includes a digital interface (not illustrated) that outputs the angular velocity data DOUT, and a signal used by the digital interface is the digital signal DSI. Alternatively, the digital signal DSI may be a control signal for controlling an operation of the circuit device 300. For example, the control signal may be a trigger signal. Here, the digital signal DSI is a signal configured by binary signal levels corresponding to binary logic levels, and is, for example, a clock signal, a data signal, a communication control signal, or the like.

The signal generation circuit 70 generates a noise reduction signal NRS that reduces noise of the detection signals S1 and S2 due to the digital signal DSI, based on the digital signal DSI. As will be described below, the digital signal DSI is propagated to the detection signals S1 and S2 by an electrostatic coupling leakage and becomes noises of the detection signals S1 and S2. If there is a difference between amplitudes of the noises in the detection signals S1 and S2, there is a possibility that the noise component is mixed to the angular velocity signal. Hereinafter, influence of the digital signal DSI on the physical quantity signal is also referred to as digital interference. The noise reduction signal NRS is a signal for reducing the noise component due to the digital interference. The noise reduction signal NRS is a signal obtained by attenuating an amplitude of the digital signal DSI and may be either an inverted signal or a non-inverted signal with respect to the digital signal DSI.

The amplification circuit 64 performs addition processing of signals obtained by amplifying the detection signals S1 and S2 and the noise reduction signal NRS and outputs the output signals AMQ1 and AMQ2. More specifically, the signals obtained by amplifying the detection signals S1 and S2 are differential signals, and the noise reduction signal NRS is added to one of the two signals configuring the differential signals. In a case where the noise reduction signal NRS is added to one signal having a larger noise component among the detection signals S1 and S2, the noise reduction signal NRS is an inverted signal of the digital signal DSI. In a case where the noise reduction signal NRS is added to one signal having the smaller noise component among the detection signals S1 and S2, the noise reduction signal NRS is a non-inverted signal of the digital signal DSI. By doing so, in the output signals AMQ1 and AMQ2 after the addition processing, amplitudes of the noises due to the electrostatic coupling leakage are approximately the same and the noises can be removed by a synchronization detection.

Figure 2:
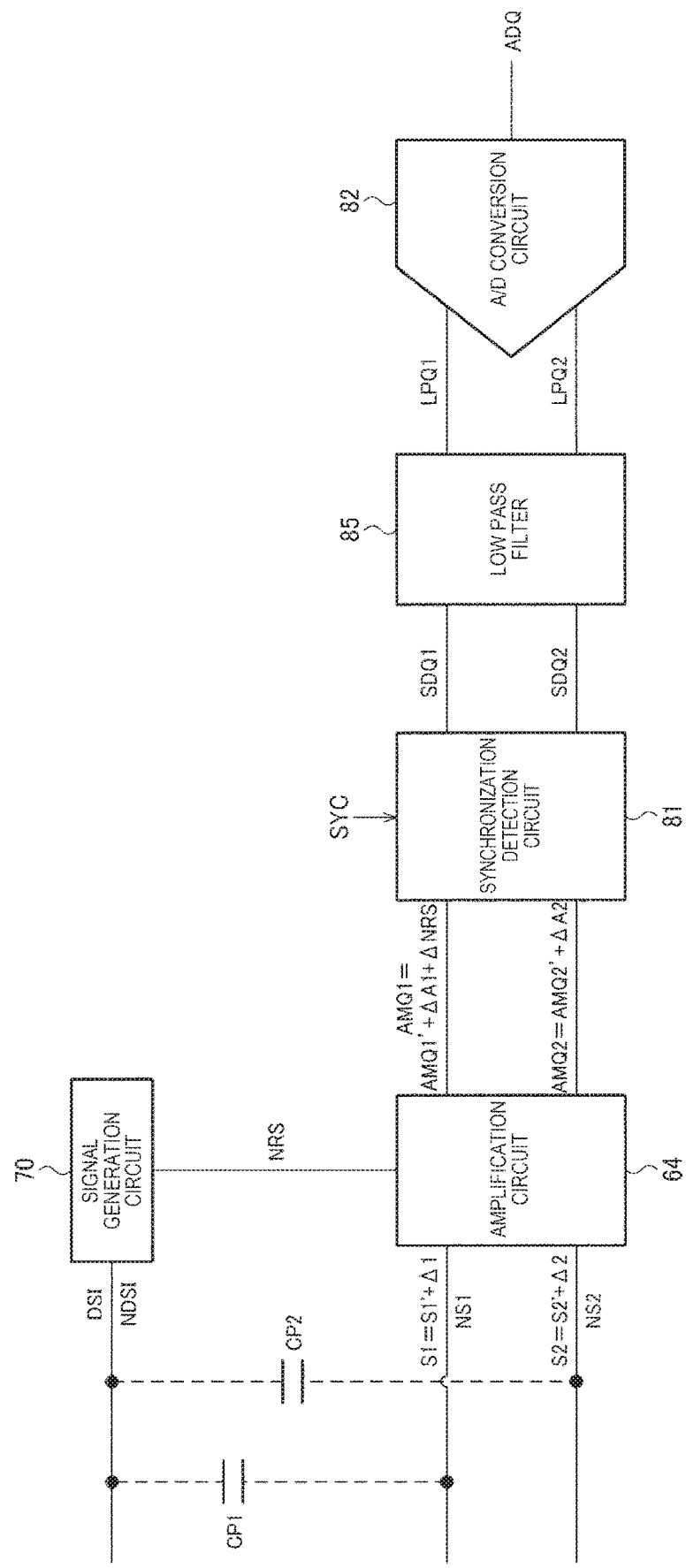
FIG. 2 is a diagram illustrating an influence on a physical quantity signal due to digital interference and an operation of the circuit device.
Figure 3:
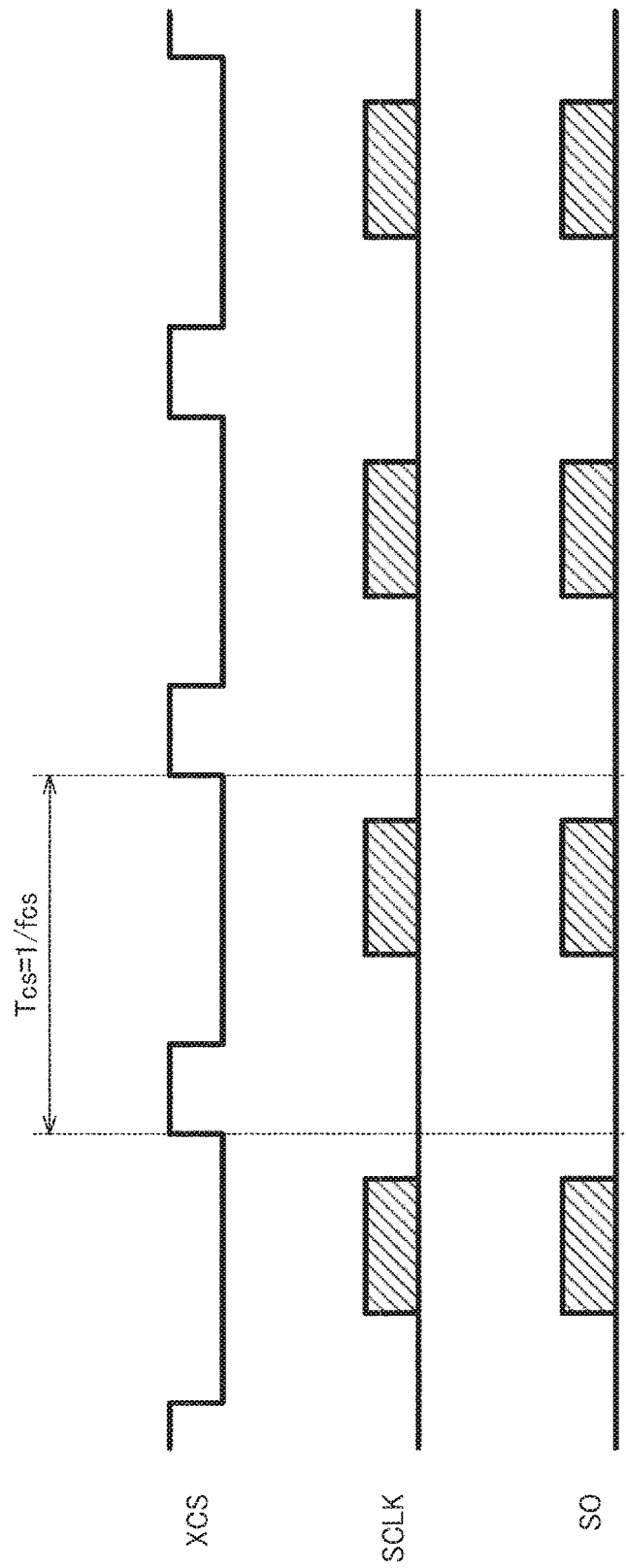
FIG. 3 is a diagram illustrating the influence on the physical quantity signal due to the digital interference and the operation of the circuit device.
Figure 4:
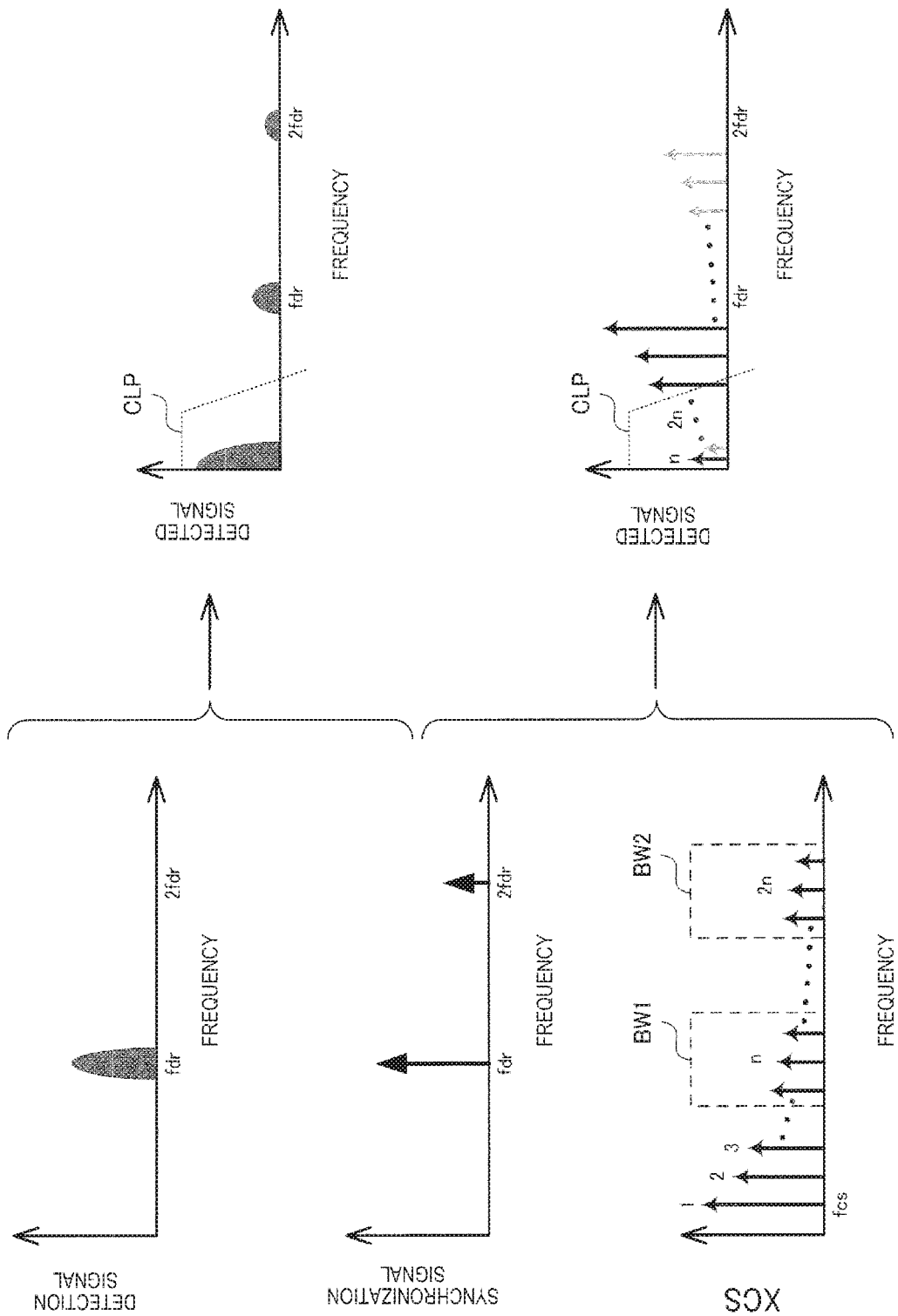
FIG. 4 is a diagram illustrating the influence on the physical quantity signal due to the digital interference and the operation of the circuit device.

FIGS. 2 to 4 are diagrams illustrating influence on the physical quantity signal due to the digital interference and an operation of the circuit device 300.

As illustrated in FIG. 2, a node NDSI of the digital signal DSI and a node NS1 of the signal S1 are coupled by a parasitic capacitance CP1, and node NDSI of the digital signal DSI and a node NS2 of the signal S2 are coupled by a parasitic capacitance CP2. For example, the vibrator 10 and the circuit device 300 are connected by a wire in the package, and the digital signal DSI is input or output via an external terminal of the package and a wire in the package. The parasitic capacitances CP1 and CP2 are generated between the wires in the package.

Due to the coupling, the detection signals become S1=S1'+Δ1 and S2=S2'+Δ2. S1' and S2' correspond to true detection signals detected by the vibrator 10, and are detection signals whose noises are removed. Δ1 and Δ2 are electrostatic coupling leakage components of the digital signal DSI due to the parasitic capacitances CP1 and CP2. Generally, since CP1≠CP2 depending on arrangements of the wires in the package, the electrostatic coupling leakage components become Δ1≠Δ2. If the amplification circuit 64 amplifies the detection signals S1 and S2 including the electrostatic coupling leakage components as they are, AMQ1=AMQ1'+ΔA1 and AMQ2=AMQ2'+ΔA2. Since the electrostatic coupling leakage components are Δ1≠Δ2, ΔA1≠ΔA2. When the synchronization detection circuit 81 performs the synchronization detection, the noise components of ΔA1−ΔA2≠0 are also synchronously detected, but in a case where the noise for which the synchronization detection is performed is in a measurement band of the angular velocity, there is a risk that a measurement accuracy of the angular velocity is reduced. An operation in a frequency domain will be described with reference to FIGS. 3 and 4.

FIG. 3 illustrates an example of the digital signal DSI. Here, a case where the circuit device 300 performs communication using a serial peripheral interface (SPI) method will be described as an example, but the invention is not limited thereto, and the invention can be applied to various interface methods. In addition, as long as a periodic waveform is generated, the invention can also be applied to a case where a control signal such as a trigger signal is used.

As illustrated in FIG. 3, an external device of the gyro sensor continuously reads the angular velocity data in a constant cycle Tcs. At this time, a selection signal XCS of an SPI, a clock signal SCLK, and a data signal SO have periodicity of a frequency fcs. Here, Tcs=1/fcs. The digital signal DSI may be any one of the selection signal XCS, the clock signal SCLK, and the data signal SO, but DSI=XCS will be described below as an example.

As illustrated in an upper left stage of FIG. 4, a detection signal of the vibrator 10 has a frequency component near a drive frequency fdr of the vibrator 10. The detection signal corresponds to S1' and S2' in FIG. 2 and is a detection signal not subjected to a digital interference. As illustrated in a middle left stage of FIG. 4, the synchronization signal SYC for controlling the synchronization detection has a frequency as the drive frequency fdr and has frequency components of integer multiples of fdr. As illustrated in an upper right stage of FIG. 4, if the detection signal of the vibrator 10 is synchronously detected, detection signals distributed near fdr are detected as signals close to DC. In addition, the signal for which synchronization detection is completed includes a harmonic wave which is configured by frequencies of integral multiples of fdr. An angular velocity signal is obtained by extracting components close to the DC by performing low pass filter processing from the synchronously detected signal. Characteristics of the low pass filter processing are indicated by CLP.

As illustrated in a lower left stage of FIG. 4, the selection signal XCS has a frequency component of an integral multiple of the read frequency fcs. The noise components Δ1 and Δ2 generated in the detection signals S1 and S2 due to the digital interference have the same frequency characteristics as the selection signal XCS when the selection signal XCS propagates through the parasitic capacitances CP1 and CP2. As illustrated in the lower left stage and a lower right stage of FIG. 4, if the noise components are synchronously detected, frequency components of the noise included in the bands BW1 and BW2 centered on the integral multiples of fdr are looped back into a band of the low pass filter processing. For example, in a case where n×fcs is close to fdr wherein n is an integer greater than or equal to 1, noise components of n×fcs and 2n×fcs are detected close to DC and are included in the band of the low pass filter processing. Since the noise component is an error component for the detection signal of the angular velocity, there is a risk that a detection accuracy is reduced.

As illustrated in FIG. 2, in the present embodiment, the signal generation circuit generates the noise reduction signal NRS from the digital signal DSI, and the amplification circuit 64 adds the noise reduction signal NRS to the output signal of the amplification circuit 64. For example, in a case where the noise reduction signal NRS is added to AMQ1, AMQ1=AMQ1'+ΔA1+ΔNRS and AMQ2=AMQ2'+ΔA2. ΔNRS is a signal added by the noise reduction signal NRS. In a case where the digital signal DSI is the selection signal XCS, the noise reduction signal NRS is obtained by attenuating the selection signal XCS, and the noise components Δ1 and Δ2 caused by the electrostatic coupling leakage of the selection signal XCS are also obtained by attenuating the selection signal XCS. Accordingly, by appropriately setting an attenuation coefficient of the noise reduction signal NRS, ΔA1+ΔNRS and ΔA2 can have the same amplitude, and the noise component can be canceled as differential signals. By canceling the noise component as the differential signals, the noise component is removed in the differential synchronization detection. That is, it is possible to reduce the noise included in the band of the low pass filter processing illustrated in the lower right diagram of FIG. 4.

2. Detailed Configuration Example

Figure 5:
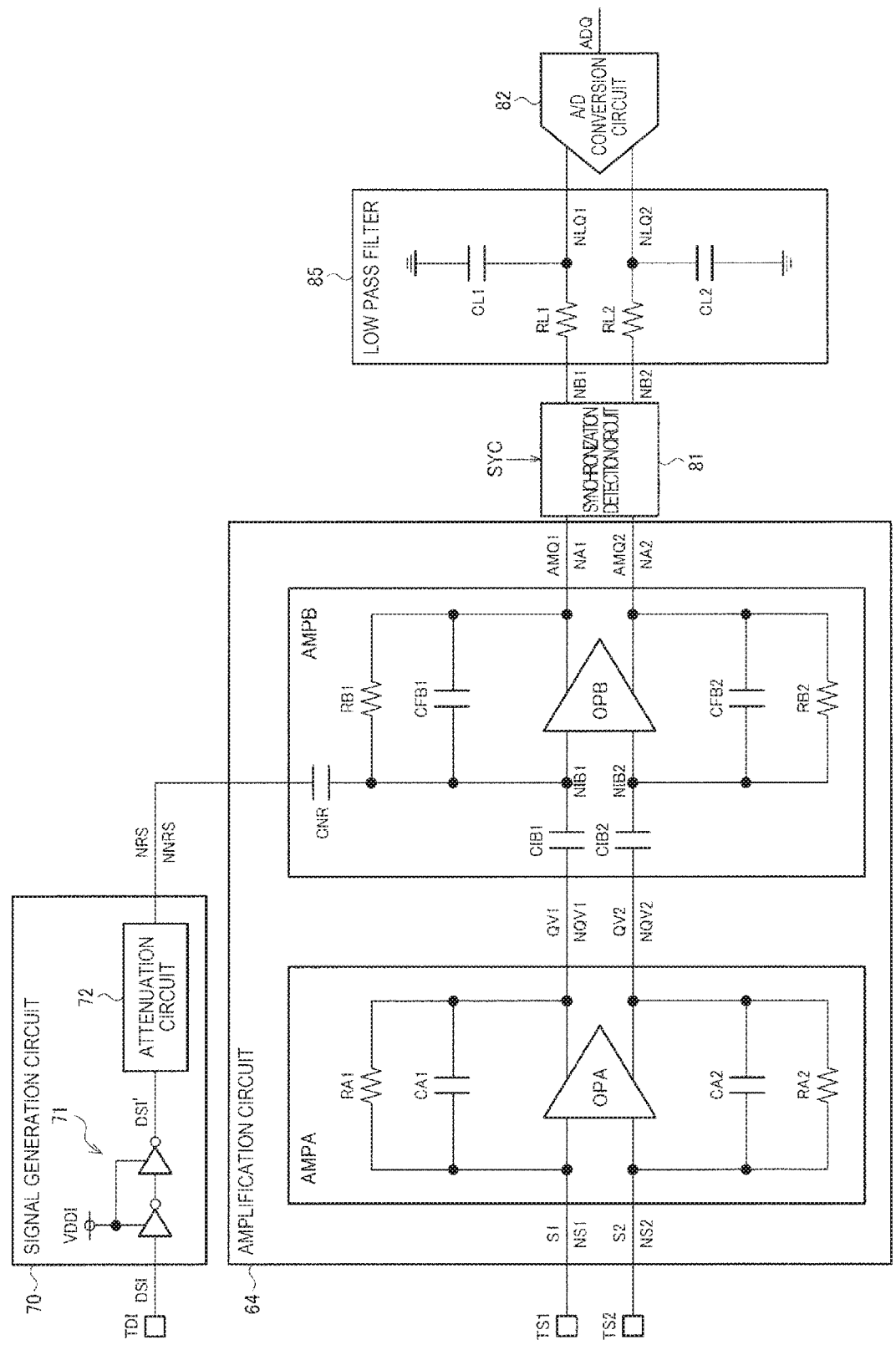
FIG. 5 is a detailed configuration example of a signal generation circuit, an amplification circuit, and a low pass filter.

FIG. 5 is a detailed configuration example of the signal generation circuit 70, the amplification circuit 64, and the low pass filter 85. First, the signal generation circuit 70 will be described. The signal generation circuit 70 includes a buffer circuit 71 and an attenuation circuit 72.

The buffer circuit 71 buffers the digital signal DSI. The buffer circuit 71 is configured with, for example, two inverters connected in series. The inverters are also called a logic inversion circuit. The buffer circuit 71 operates at a power supply voltage VDDI. For example, in a case where the digital signal DSI is a signal received or transmitted by the interface circuit 90 illustrated in FIG. 17, the power supply voltage VDDI is a power supply voltage of the interface circuit 90.

The attenuation circuit 72 attenuates a signal level of the digital signal DSI and outputs the attenuated signal as the noise reduction signal NRS. Specifically, the attenuation circuit 72 attenuates a buffered digital signal DSI'. An attenuation gain is variably set, based on setting information set in, for example, a register or a nonvolatile memory which are not illustrated. It is preferable that a signal line of the noise reduction signal NRS from the attenuation circuit 72 to a second amplifier circuit AMPB is shielded by a grounded and shielded wire or the like. The buffer circuit 71 may be omitted. That is, the digital signal DSI may be directly input to the attenuation circuit 72.

As described above, the noise components generated in the detection signals S1 and S2 due to the digital interference are due to attenuation of the digital signal DSI. According to the present embodiment, since the noise reduction signal NRS obtained by attenuating the digital signal DSI is generated, the noise component due to the digital interference can be reduced by the noise reduction signal NRS.

Figure 6:
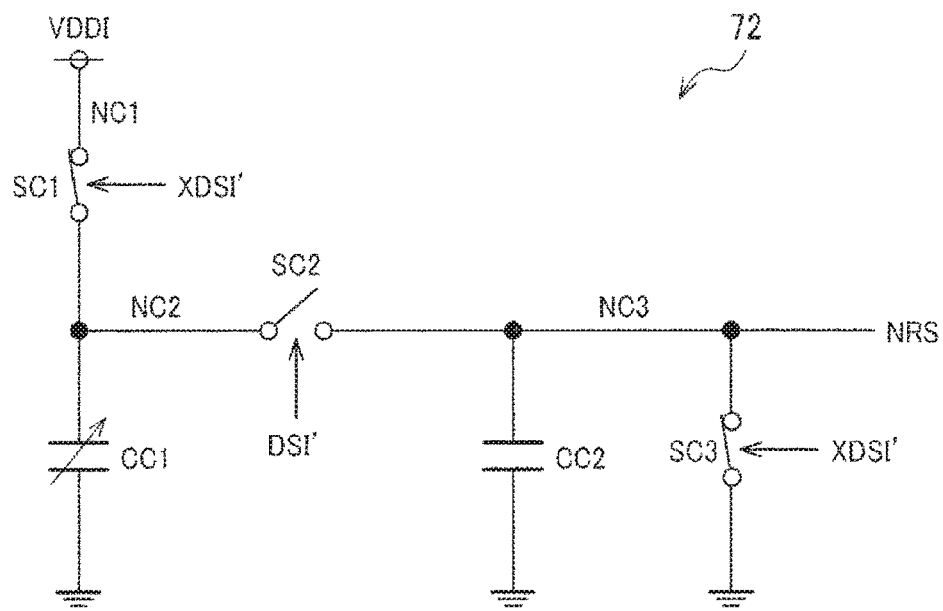
FIG. 6 illustrates a detailed first configuration example of an attenuation circuit.

FIG. 6 illustrates a detailed first configuration example of the attenuation circuit 72. The attenuation circuit 72 illustrated in FIG. 6 includes a first switch SC1, a second switch SC2, a third switch SC3, a variable capacitance circuit CC1, and a capacitor CC2.

The first switch SC1 is provided between a first node NC1 to which the power supply voltage VDDI is input and a second node NC2. That is, one terminal of the first switch SC1 is connected to the first node NC1 and the other terminal is connected to the second node NC2. The power supply voltage VDDI is a power supply voltage of the buffer circuit 71, and is, for example, a power supply voltage of the interface circuit 90 illustrated in FIG. 17. The first switch SC1 is, for example, a transistor.

The variable capacitance circuit CC1 is provided between the second node NC2 and a ground node. That is, one terminal of the variable capacitance circuit CC1 is connected to the second node NC2, and the other terminal is connected to the ground node. The variable capacitance circuit CC1 can variably set a capacitance value between the second node NC2 and the ground node. For example, the capacitance value is variably set based on the setting information set in a register or a nonvolatile memory which is not illustrated. The variable capacitance circuit CC1 is configured with a capacitor array and a switch array that performs switching as to whether each capacitor of the capacitor array is connected between the second node NC2 and the ground node.

The second switch SC2 is provided between the second node NC2 and a third node NC3 from which the noise reduction signal NRS is output. That is, one terminal of the second switch SC2 is connected to the second node NC2, and the other terminal is connected to the third node NC3. The second switch SC2 is, for example, a transistor.

The capacitor CC2 is provided between the third node NC3 and the ground node. That is, one terminal of the capacitor CC2 is connected to the third node NC3, and the other terminal is connected to the ground node.

The third switch SC3 is provided between the third node NC3 and the ground node. That is, one terminal of the third switch SC3 is connected to the third node NC3, and the other terminal is connected to the ground node. The third switch SC3 is, for example, a transistor.

The first and third switches SC1 and SC3 are turned on or off based on a logical inversion signal XDSI' of a digital signal DSI'. The second switch SC2 is turned on or off based on the digital signal DSI'. Specifically, during a period in which the digital signal DSI' is at a first logic level, the first and third switches SC1 and SC3 are turned on and the second switch SC2 is turned off. The power supply voltage VDDI is input to one terminal of the variable capacitance circuit CC1, and both terminals of the capacitor CC2 are connected to the ground node to initialize electric charges. That is, a voltage of the ground node is output to the third node NC3 as the noise reduction signal NRS. During a period in which the digital signal DSI' is at a second logic level, the first and third switches SC1 and SC3 are turned off and the second switch SC2 is turned on. One terminal of the variable capacitance circuit CC1 is connected to the one terminal of the capacitor CC2, and a voltage level of the power supply voltage VDDI is divided by a charge redistribution. The divided voltage level is output to the third node NC3 as the noise reduction signal NRS.

According to the configuration example of FIG. 6, the voltage level of the power supply voltage VDDI is divided by the charge redistribution, and thereby, it is possible to generate the noise reduction signal NRS attenuating the digital signal DSI'. In addition, an attenuation gain can be variably set by setting a capacitance value of the variable capacitance circuit CC1. A difference in the noise components occurring in the detection signals S1 and S2 due to a digital interference varies depending on, for example, a model of the gyro sensor, a manufacturing variation, and the like. Since the attenuation gain can be adjusted, a signal level of the noise reduction signal NRS can be appropriately adjusted, and the noise components can be canceled.

Figure 7:
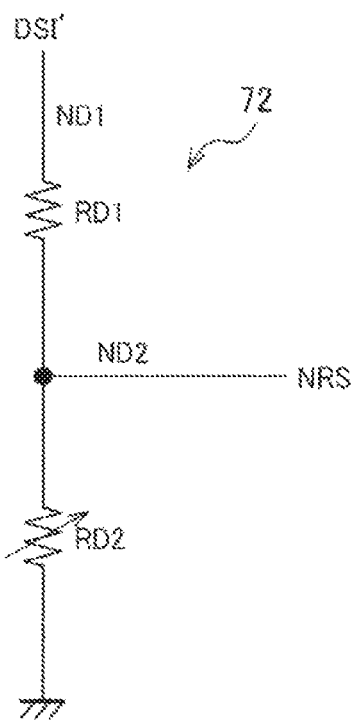
FIG. 7 is a detailed second configuration example of the attenuation circuit.

FIG. 7 illustrates a detailed second configuration example of the attenuation circuit 72. The attenuation circuit 72 illustrated in FIG. 7 includes a resistor RD1 and a variable resistance circuit RD2.

One terminal of the resistor RD1 is connected to a node ND1 to which the digital signal DSI' is input and the other terminal is connected to a node ND2.

One terminal of the variable resistance circuit RD2 is connected to the node ND2, and the other terminal is connected to the ground node. The variable resistance circuit RD2 can variably set a resistance value between the node ND2 and the ground node. For example, the resistance value is variably set based on setting information set in a register or a nonvolatile memory which is not illustrated. For example, the setting information is determined at the time of manufacturing a circuit protection. For example, the variable resistance circuit RD2 includes a resistor array and a switch array that performs switching as to whether each resistor of the resistor array is connected between the node ND2 and the ground node.

A signal level of the digital signal DSI' is divided by the resistor RD1 and the variable resistance circuit RD2, and the divided digital signal DSI' is output to the node ND2 as the noise reduction signal NRS. An attenuation gain can be variably set by setting a resistance value of the variable resistance circuit RD2.

According to the configuration of FIG. 7, the attenuation circuit 72 is a resistance circuit in which the signal level of the digital signal DSI' is divided by a resistance voltage division and a voltage division ratio of the resistance voltage division is variable. By doing so, the noise reduction signal NRS obtained by attenuating the digital signal DSI' can be generated by the resistance voltage division. In addition, since an attenuation gain can be adjusted, the signal level of the noise reduction signal NRS can be appropriately adjusted, and noise components can be canceled.

The configuration of the attenuation circuit 72 which uses the resistance voltage division is not limited to FIG. 7. For example, RD1 may be used as a variable resistance circuit. Alternatively, a ladder resistor may be provided between the node ND1 and the ground node, and any one of the plurality of voltages divided by the ladder resistor may be selected by a switch circuit.

As illustrated in FIG. 5, the amplification circuit 64 includes a first amplifier circuit AMPA and the second amplifier circuit AMPB. The first amplifier circuit AMPA amplifies the detection signals S1 and S2 and outputs the amplified detection signals as a first output signal. The second amplifier circuit AMPB amplifies the first output signal and adds the noise reduction signal NRS to the amplified first output signal.

According to the present embodiment, the noise reduction signal NRS is added to a signal obtained by amplifying the detection signals S1 and S2. Thereby, the noise components included in the detection signals S1 and S2 can be canceled by the noise reduction signal NRS.

Specifically, the first amplifier circuit AMPA amplifies the detection signals S1 and S2, and outputs a first signal QV1 and a second signal QV2 in a differential signal relationship between each other as the first output signal. The second amplifier circuit AMPB amplifies the first output signal and adds the noise reduction signal NRS to one of the first signal QV1 and the second signal QV2. In FIG. 5, the noise reduction signal NRS is added to the first signal QV1, but the noise reduction signal NRS may be added to the second signal QV2.

According to the present embodiment, by adding the noise reduction signal NRS to one of the first signal QV1 and the second signal QV2, amplitudes of the noise components included in the detection signals S1 and S2 are adjusted to approximately the same extent. Thereby, it is possible to cancel the noise components when viewed as the differential signals.

In addition, since a noise amplitude due to an electrostatic coupling leakage is very small, it is necessary to greatly reduce an attenuation factor when the noise reduction signal NRS is generated from the digital signal DSI. That is, since the noise reduction signal NRS itself is like noise, it is very difficult to accurately generate a very small signal. In this regard, according to the present embodiment, by adding the noise reduction signal NRS in the second amplifier circuit AMPB, the detection signals S1 and S2 are amplified by the first amplifier circuit AMPA, and then, the noise reduction signal NRS can be added. Since the noise component is also amplified by the first amplifier circuit AMPA, an attenuation rate of the noise reduction signal NRS added to the amplified noise component can be increased. That is, the attenuation rate of the noise reduction signal NRS can be increased as compared with a case where the noise reduction signal NRS is added in the first amplifier circuit AMPA. Thereby, the noise reduction signal NRS is easily adjusted to an appropriate amplitude.

The first amplifier circuit AMPA includes an operational amplifier OPA, capacitors CA1 and CA2, and resistors RA1 and RA2.

Input nodes of the operational amplifier OPA are referred to as nodes NS1 and NS2. The detection signals S1 and S2 are input to the nodes NS1 and NS2. Output nodes of the operational amplifier OPA are referred to as nodes NQV1 and NQV2. One terminal of the capacitor CA1 and one terminal of the resistor RA1 are connected to the node NS1, and the other terminals are connected to the node NQV1. One terminal of the capacitor CA2 and one terminal of the resistor RA2 are connected to the node NS2, and the other terminals are connected to the node NQV2. The first amplifier circuit AMPA is a charge voltage conversion circuit that converts the detection signals S1 and S2, which are charge signals, into differential voltage signals.

The second amplifier circuit AMPB includes an operational amplifier OPB, a first input capacitor CIB1, a second input capacitor CIB2, a first feedback capacitor CFB1, a second feedback capacitor CFB2, resistors RB1 and RB2, and a capacitor circuit CNR.

The first input capacitor CIB1 is provided between the node NQV1 to which the first signal QV1 is input and a first input node NIB1 of the operational amplifier OPB. That is, one terminal of the first input capacitor CIB1 is connected to the node NQV1, and the other terminal is connected to the first input node NIB1. The first feedback capacitor CFB1 is provided between the first input node NQV1 and a first output node NA1 of the operational amplifier OPB. That is, one terminal of the first feedback capacitor CFB1 is connected to the node NIB1, and the other terminal is connected to the first output node NA1. One terminal of the resistor RB1 is connected to the node NIB1, and the other terminal is connected to the first output node NA1.

The second input capacitor CIB2 is provided between the node NQV2 to which the second signal QV2 is input and a second input node NIB2 of the operational amplifier OPB. That is, one terminal of the second input capacitor CIB2 is connected to the node NQV2, and the other terminal is connected to the second input node NIB2. The second feedback capacitor CFB2 is provided between the second input node NQV2 and a second output node NA2 of the operational amplifier OPB. That is, one terminal of the second feedback capacitor CFB2 is connected to the node NIB2, and the other terminal is connected to the second output node NA2. One terminal of the resistor RB2 is connected to the node NIB2, and the other terminal is connected to the second output node NA2.

The capacitor circuit CNR is provided between a node NNRS to which the noise reduction signal NRS is input and the first input node NIB1. That is, one terminal of the capacitor circuit CNR is connected to the node NNRS, and the other terminal is connected to the first input node NIB1. The capacitor circuit CNR may be provided between the node NNRS and the second input node NIB2. According to the second amplifier circuit AMPB described above, the noise reduction signal NRS can be added to the first signal QV1. That is, the first signal QV1 is amplified by a gain of CIB1/CFB1 and the noise reduction signal NRS is amplified by a gain of CNR/CFB1. A signal obtained by adding the amplified signals is output as a signal AMQ1.

The capacitor circuit CNR may be a variable capacitance circuit whose capacitance value is variable.

Figure 8:
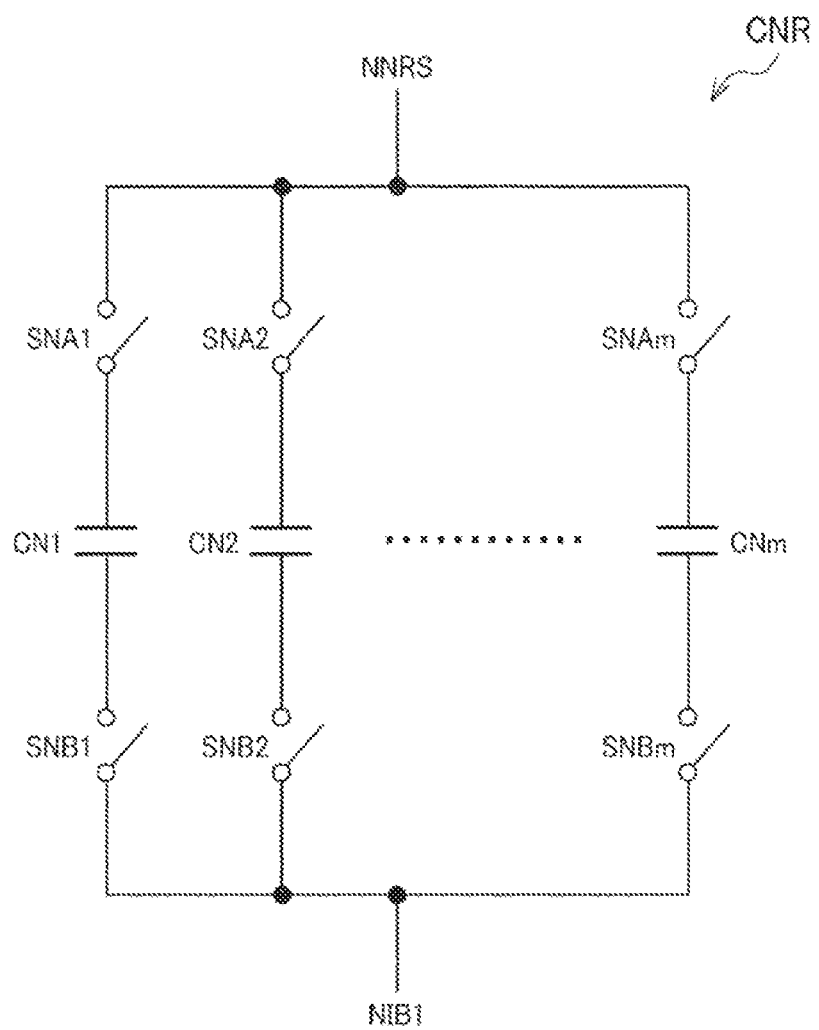
FIG. 8 is a detailed configuration example of a capacitor circuit in a case of a variable capacitance circuit.

FIG. 8 is a detailed configuration example of the capacitor circuit CNR in a case of a variable capacitance circuit. The capacitor circuit CNR of FIG. 8 includes switches SNA1 to SNAm, capacitors CN1 to CNm, and switches SNB1 to SNBm. m is an integer greater than or equal to 2.

The Switch SNAi, the capacitor CNi, and the switch SNBi are connected in series between the node NNRS and the node NIB1. i is an integer greater than or equal to 1 and smaller than or equal to m. The Switches SNA1 to SNAm and the switches SNB1 to SNBm are turned on or off based on setting information set in, for example, a register or a nonvolatile memory which is not illustrated, and a capacitor connected between the node NNRS and the node NIB1 Is selected. For example, the setting information is determined at the time of manufacturing a circuit protection.

By configuring the capacitor circuit CNR as a variable capacitance circuit in this way, a gain can be adjusted when the noise reduction signal NRS is added by the second amplifier circuit AMPB. Thereby, the gain can be adjusted not only at the time of attenuation in attenuation circuit 72 but also at the time of addition. As described above, since the noise component canceled by the noise reduction signal NRS is very small, it is possible to add the noise reduction signal NRS with more appropriate gain by adjusting the gain also at the time of addition.

Figure 9:
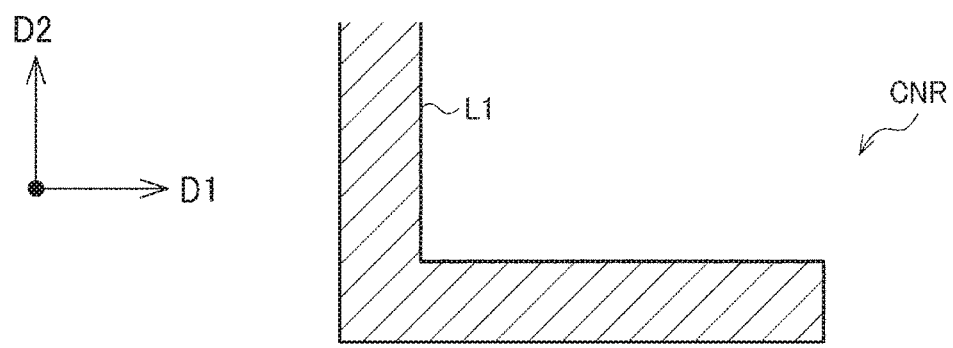
FIG. 9 is a configuration example of a capacitor configuring the capacitor circuit.

FIG. 9 illustrates a configuration example of a capacitor configuring the capacitor circuit CNR. Each of the capacitors CN1 to CNm in FIG. 8 can be configured by the same capacitors.

FIG. 9 illustrates a layout configuration example of a wiring layer when the wiring layer in which a capacitor is formed is viewed in a plan view in a thickness direction of a semiconductor substrate. The capacitor includes wires L1 and L2 arranged in the same wiring layer. The wires L1 and L2 include wiring portions arranged in parallel in a direction D1. A capacitance value of a parasitic capacitance generated between the wiring portions arranged in parallel becomes a capacitance value of the capacitor. In the example of FIG. 9, the wiring portions arranged in a direction D2 are connected to the wiring portions arranged in parallel in the direction D1. However, the layout configuration is not limited to this, and the wires L1 and L2 may be configured to have wiring portions arranged in parallel.

As described above, since noise components canceled by the noise reduction signal NRS are very small, the gain CNR/CFB1 needs to be very small when the noise reduction signal NRS is added in the second amplifier circuit AMPB. According to the present embodiment, the gain CNR/CFB1 can be reduced by configuring the capacitor circuit CNR with parasitic capacitors between wires.

As illustrated in FIG. 5, the low pass filter 85 includes resistors RL1 and RL2 and capacitors CL1 and CL2.

One terminal of the resistor RL1 is connected to the node NB1, and the other terminal is connected to a node NLQ1. One terminal of the resistor RL2 is connected to the node NB2, and the other terminal is connected to a node NLQ2. One terminal of the capacitor CL1 is connected to the node NLQ1, and the other terminal is connected to the ground node. One terminal of the capacitor CL2 is connected to the node NLQ2, and the other terminal is connected to the ground node. The low pass filter 85 smooths an output signal of the synchronization detection circuit 81. In addition, the low pass filter 85 functions as an anti-aliasing filter of the A/D conversion circuit 82. Characteristic CLP of the low pass filter processing in FIG. 4 is a frequency characteristic of the digital filter processing performed by the low pass filter 85 or the processing circuit 100.

Figure 10:
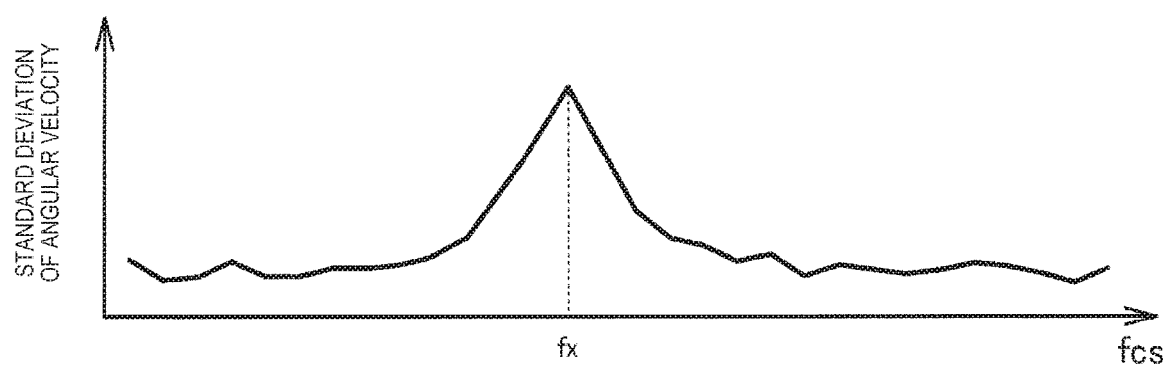
FIG. 10 illustrates an example of measurement results in a case where a digital interference reduction method according to the present embodiment is not used.

FIG. 10 illustrates an example of measurement results in a case where a digital interference reduction method according to the present embodiment is not used. In FIG. 10, a horizontal axis represents a read frequency fcs of FIG. 3, and a vertical axis represents a standard deviation of the measured angular velocity. An angular velocity is not applied to the vibrator 10. As illustrated in FIG. 10, when the read frequency fcs is fx, a standard deviation of the angular velocity reaches a peak. That is, when the read frequency fcs is close to fx, variation occurs in the angular velocity which is measured. As described with reference to FIG. 4, the frequency fx corresponds to the read frequency fcs when n×fcs=fdr.

In order to adjust an attenuation gain of the attenuation circuit 72, for example, the read frequency is set to fcs=fx to read angular velocity data, and the standard deviation of the angular velocity is acquired while the attenuation gain is changed depending on register setting. Then, a gain of the attenuation at which the standard deviation of the angular velocity becomes the minimum is set as a final setting value.

FIG. 11 illustrates an example of measurement results in a case where the digital interference reduction method according to the present embodiment is used. A horizontal axis and a vertical axis are the same as in FIG. 10. As illustrated in FIG. 11, a peak of the frequency fx is reduced as compared with FIG. 10. That is, it can be seen that a digital interference due to the digital signal DSI can be canceled by using the digital interference reduction method according to the present embodiment.

FIG. 12 illustrates a frequency characteristic example of a transfer function of a signal path for generating the digital interference. FIG. 13 illustrates a frequency characteristic example of the transfer function of the signal path for canceling the digital interference. FIG. 14 illustrates a frequency characteristic example of a ratio between the two transfer functions.

The signal path for generating the digital interference is a path passing through the parasitic capacitance CP1 in FIG.

2, the first amplifier circuit AMPA in FIG. 5, and the second amplifier circuit AMPB in FIG. 5. A gain and a phase of the transfer function of the signal path are the frequency characteristics illustrated in FIG. 12. The signal path for canceling the digital interference is a path passing through the signal generation circuit 70 and the second amplifier circuit AMPB in FIG. 5. A gain and a phase of the transfer function of the signal path are the frequency characteristics illustrated in FIG. 13. As illustrated in FIG. 14, a ratio of the transfer functions is substantially flat in a frequency band NRBW and is flat with the phase being substantially zero. Thereby, it can be seen that noise components due to the digital interference can be canceled in the frequency band NRBW. At least the drive frequency fdr of the vibrator 10 is included in the frequency band NRBW. A noise reduction effect can be enhanced as frequencies of integral multiples of fdr are included in the frequency band NRBW to a higher frequency.

3. Other Configuration Example

FIG. 15 illustrates a detailed second configuration example of the signal generation circuit 70. The signal generation circuit 70 of FIG. 15 includes a buffer circuit 71 and an attenuation circuit 72.

The buffer circuit 71 can switch between a first mode for outputting an inverted signal of the digital signal DSI and a second mode for outputting a non-inverted signal of the digital signal DSI. Specifically, the buffer circuit 71 includes inverters IV1 and IV2 and switches SBF1 and SBF2.

The inverter IV1 inverts a logic level of the digital signal DSI and the inverter IV2 inverts a logic level of an output signal of the inverter IV1. One terminal of the switch SBF1 is connected to an output node of the inverter IV1 and the other terminal is connected to an output node of the buffer circuit 71. One terminal of the switch SBF2 is connected to an output node of the inverter IV2, and the other terminal is connected to the output node of the buffer circuit 71. The switches SBF1 and SBF2 are configured with, for example, transistors. In the first mode, the switch SBF1 is turned on and the switch SBF2 is turned off. Thereby, a logically inverted signal of the digital signal DSI is output as the digital signal DSI'. In the second mode, the switch SBF1 is turned off and the switch SBF2 is turned on. Thereby, a logically non-inverted signal of the digital signal DSI is output as the digital signal DSI'. The first and second modes are set based on setting information set in, for example, a register or a nonvolatile memory which is not illustrated. As described with reference to FIG. 2, amplitudes of the noise components Δ1 and Δ2 included in the detection signals S1 and S2 are dependent on capacitance values of the parasitic capacitances CP1 and CP2 causing electrostatic coupling leakage. Accordingly, either a case where the amplitude of the noise component Δ1 is larger or a case where the amplitude of the noise component Δ2 is larger can be considered. According to the present embodiment, since switching between inversion and non-inversion of the noise reduction signal NRS can be performed, the present embodiment can also be applied to either case. For example, a case where the noise reduction signal NRS is added to the detection signal S1 side will be taken as an example. In a case where the amplitude of the noise component Δ1 is larger, the inverted digital signal DSI is attenuated to generate the noise reduction signal NRS. In a case where the amplitude of the noise component Δ2 is larger, the non-inverted digital signal DSI is attenuated to generate the noise reduction signal NRS. Thereby, amplitudes of the noise components after the addition can be approximately the same.

Figure 16:
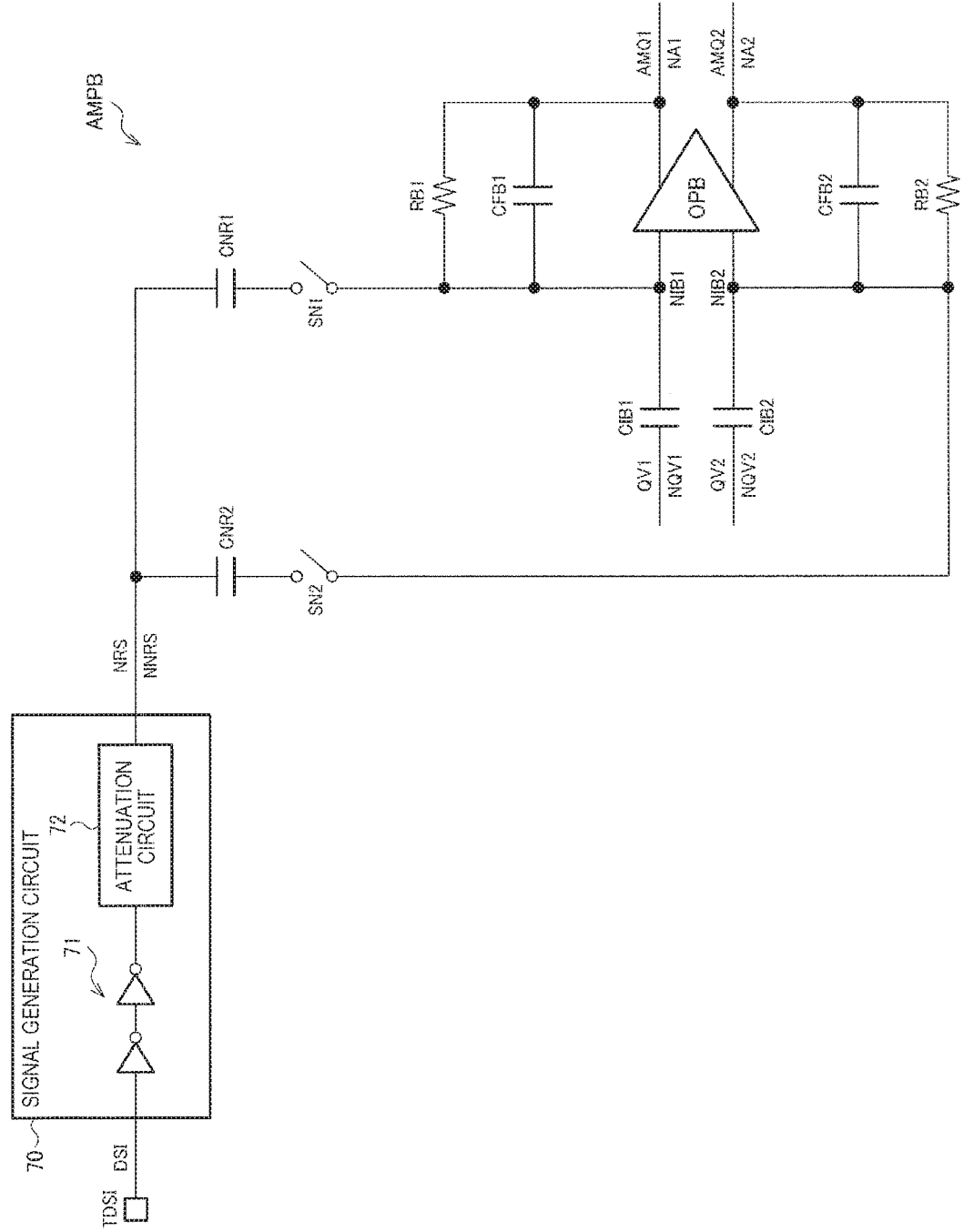
FIG. 16 illustrates a detailed second configuration example of a second amplifier circuit.

FIG. 16 illustrates a detailed second configuration example of the second amplifier circuit AMPB. In FIG. 16, the second amplifier circuit AMPB includes a first capacitor CNR1, a first capacitor connection switch SN1, a second capacitor CNR2, and a second capacitor connection switch SN2.

The first capacitor CNR1 and the first capacitor connection switch SN1 are provided in series between the node NNRS to which the noise reduction signal NRS is input and the first input node NIB1 of the operational amplifier OPB. Specifically, one terminal of the first capacitor CNR1 is connected to the node NNRS, and the other terminal is connected to one terminal of the first capacitor connection switch SN1. The other terminal of the first capacitor connection switch SN1 is connected to the first input node NIB1.

The second capacitor CNR2 and the second capacitor connection switch SN2 are provided in series between the node NNRS to which the noise reduction signal NRS is input and the second input node NIB2 of the operational amplifier OPB. Specifically, one terminal of the second capacitor CNR2 is connected to the node NNRS, and the other terminal is connected to one terminal of the second capacitor connection switch SN2. The other terminal of the second capacitor connection switch SN2 is connected to the second input node NIB2.

In the first mode, the first capacitor connection switch SN1 is turned on and the second capacitor connection switch SN2 is turned off. Meanwhile, in the second mode, the first capacitor connection switch SN1 is turned off and the second capacitor connection switch SN2 is turned on. The first and second modes are set based on setting information set in, for example, a register or a nonvolatile memory which is not illustrated.

The first and second capacitors CNR1 and CNR2 have the same configuration as the CNR illustrated in FIG. 9. The first and second capacitor connection switches SN1 and SN2 are configured with, for example, transistors. A switch may be further provided between one terminal of the CNR1 and the node NNRS or a switch may be further provided between one terminal of the CNR2 and the node NNRS.

According to the present embodiment, by setting a mode to the first mode, the noise reduction signal NRS can be added to the detection signal S1 side, and by setting the mode to the second mode, the noise reduction signal NRS can be added to the detection signal S2 side. Thereby, it is possible to select which side of the detection signals S1 and S2 is added to the noise reduction signal NRS depending on which of the noise components Δ1 and Δ2 included in the detection signals S1 and S2 is large.

Figure 17:
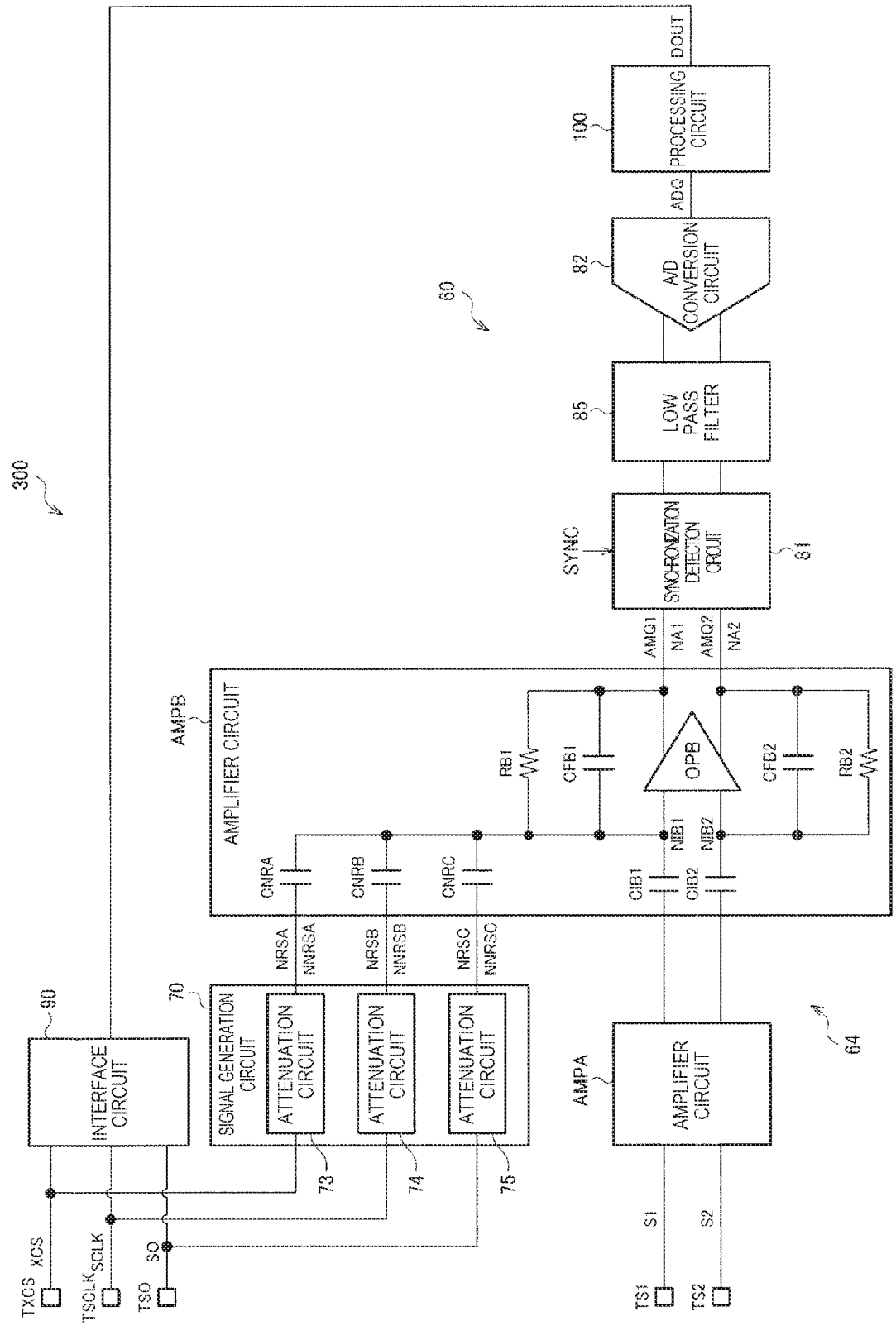
FIG. 17 illustrates a second configuration example of the circuit device.

FIG. 17 illustrates a second configuration example of the circuit device 300. In FIG. 17, the circuit device 300 includes an interface circuit 90 and communication signal terminals TXCS, TSCLK, and TSO. The signal generation circuit 70 includes attenuation circuits 73, 74, and 75, and the second amplifier circuit AMPB includes capacitors CNRA, CNRB, and CNRC.

The interface circuit 90 performs interface processing of an SPI system. Specifically, the interface processing is performed based on the selection signal XCS, the clock signal SCLK, and the data signal SO. The selection signal XCS, the clock signal SCLK, and the data signal SO are also referred to as communication signals. The communication signal terminal TXCS is a terminal to which the selection signal XCS is input, the communication signal terminal TSCLK is a terminal to which the clock signal SCLK is input, and the communication signal terminal TSO is a terminal from which the data signal SO is output.

The attenuation circuit 73 attenuates the selection signal XCS and outputs the attenuated signal as a noise reduction signal NRSA. The attenuation circuit 74 attenuates the clock signal SCLK and outputs the attenuated signal as a noise reduction signal NRSB. The attenuation circuit 75 attenuates the data signal SO and outputs the attenuated signal as a noise reduction signal NRSC. One terminal of the capacitor CNRA is connected to a node NNRSA of the noise reduction signal NRSA, and the other terminal is connected to the first input node NIB1 of the operational amplifier OPB. One terminal of the capacitor CNRB is connected to a node NNRSB of the noise reduction signal NRSB, and the other terminal is connected to the first input node NIB1 of the operational amplifier OPB. One terminal of the capacitor CNRC is connected to a node NNRSC of the noise reduction signal NRSC, and the other terminal is connected to the first input node NIB1 of the operational amplifier OPB.

According to the present embodiment, the signal generation circuit 70 generates the noise reduction signals NRSA, NRSB, and NRSC for reducing noise of the detection signals S1 and S2 due to the first to third communication signals, based on the selection signal XCS, the clock signal SCLK, and the data signal SO which are the first to third communication signals. The amplification circuit 64 performs addition processing of signals obtained by amplifying the detection signals S1 and S2 and the noise reduction signals NRSA, NRSB, and NRSC and outputs the output signals AMQ1 and AMQ2.

Thereby, it is possible to generate a noise reduction signal for each of the first to third communication signals, and to reduce a digital interference caused by each of the first to third communication signals. In the above description, a case where the first to third communication signals are input or output via the first to third communication signal terminals is described as an example, but the invention is not limited thereto, and the invention can be applied to a case where at least one of input and output of first to kth communication signals (k is an integer greater than or equal to 2) via first to the kth communication signal terminal.

In the present embodiment, the interface circuit 90 outputs physical quantity data based on the A/D conversion data ADQ of the A/D conversion circuit 82 during interface processing. In the present embodiment, the physical quantity data is the angular velocity data DOUT.

In a case where the angular velocity data DOUT is read from a gyro sensor, it is assumed that the angular velocity data DOUT is read in a constant cycle Tcs as illustrated in FIG. 3. As described with reference to FIG. 4 and the like, in a case where an integral multiple of the read frequency fcs=1/Tcs is close to the drive frequency fdr of the vibrator 10, there is a risk that a measurement accuracy of the angular velocity is reduced due to a digital interference. According to the present embodiment, it is possible to reduce the digital interference by generating a noise reduction signal from a communication signal and adding the noise reduction signal to an amplification signal of a detection signal.

4. Physical Quantity Measurement Device, Electronic Apparatus, and Vehicle

Figure 18:
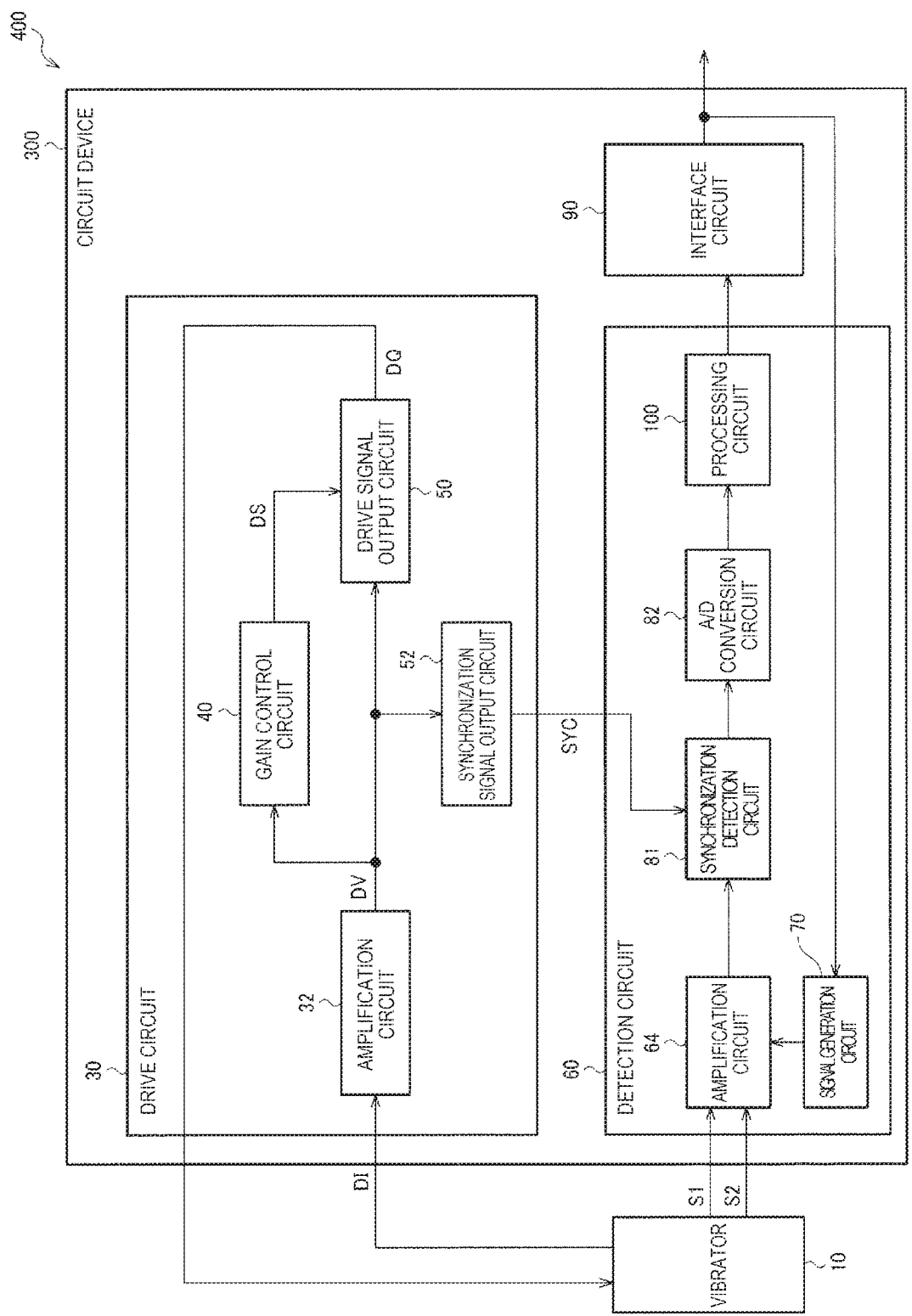
FIG. 18 illustrates a configuration example of the physical quantity measurement device including the circuit device.

FIG. 18 illustrates a configuration example of a physical quantity measurement device 400 including the circuit device 300. FIG. 18 illustrates a configuration example of a gyro sensor that detects an angular velocity as an example of the physical quantity measurement device. The circuit device 300 according to the present embodiment can be applied to a physical quantity measurement device that detects various physical quantities such as, an angular velocity, an angular acceleration, a velocity, an acceleration, a distance, a pressure, a sound pressure, a magnetic quantity, and time.

The physical quantity measurement device 400 includes the vibrator 10 and the circuit device 300. The circuit device 300 includes a drive circuit 30, the detection circuit 60, and the interface circuit 90.

The drive circuit 30 includes an amplification circuit 32 to which a feedback signal DI from the vibrator 10 is input, a gain control circuit 40 that performs an automatic gain control, and a drive signal output circuit 50 that outputs a drive signal DQ to the vibrator 10. In addition, the drive circuit 30 includes a synchronization signal output circuit that outputs the synchronization signal SYC to a synchronization detection circuit 81.

The amplification circuit 32 amplifies the feedback signal DI from the vibrator 10. Specifically, the amplification circuit 32 is an I/V conversion circuit and converts the current signal DI from the vibrator 10 into a voltage signal DV and outputs the converted signal. The amplification circuit 32 can be realized by an operational amplifier, a feedback resistance element, a feedback capacitor, and the like.

The drive signal output circuit 50 outputs the drive signal DQ, based on the signal DV amplified by the amplification circuit 32. For example, in a case where the drive signal output circuit 50 outputs the drive signal DQ of a rectangular wave, the drive signal output circuit 50 can be realized by a comparator and the like. The drive signal DQ may be configured by a sinusoidal wave.

The gain control circuit 40 outputs a control voltage DS to the drive signal output circuit 50 to control an amplitude of the drive signal DQ. Specifically, the gain control circuit 40 is an auto gain controller (AGC), monitors a signal DV and controls a gain of an oscillation loop. For example, in order to keep a sensitivity of a gyro sensor constant, the drive circuit 30 is required to keep an amplitude of a drive voltage supplied to a vibration portion for driving of the vibrator 10 constant. Accordingly, the gain control circuit 40 for automatically adjusting a gain is provided in an oscillation loop of a drive vibration system. The gain control circuit 40 variably and automatically adjusts the gain such that an amplitude of the feedback signal DI from the vibrator 10 is constant, that is, such that a vibration speed of the vibration portion for driving of the vibrator 10 is constant. The gain control circuit 40 can be realized by a full-wave rectifier that performs a full-wave rectification of the output signal DV of the amplification circuit 32, an integrator that performs integration processing of an output signal of the full-wave rectifier, and the like.

The synchronization signal output circuit 52 receives the signal DV amplified by the amplification circuit 32 and outputs the synchronization signal SYC to the detection circuit 60. The synchronization signal output circuit 52 can be realized by a comparator which performs binarization processing of the signal DV of a sinusoidal wave to generate the synchronization signal SYC of a rectangular wave, a phase adjustment circuit which adjusts a phase of the synchronization signal SYC, and the like.

The detection circuit 60 includes an amplification circuit 64, a signal generation circuit 70, a synchronization detection circuit 81, an A/D conversion circuit 82, and a processing circuit 100. The signal generation circuit 70 generates a noise reduction signal, based on a communication signal input or output by an interface circuit 90. The amplification circuit 64 receives the detection signals S1 and S2 from the vibrator 10, performs a charge voltage conversion, a differential signal amplification, a gain adjustment, and the like. In addition, the amplification circuit 64 performs addition processing of the noise reduction signal to the signals obtained by amplifying the detection signals S1 and S2. The synchronization detection circuit 81 performs a synchronization detection, based on the synchronization signal SYC from the drive circuit 30. The A/D conversion circuit 82 performs am A/D conversion of the synchronously detected signal. The processing circuit 100 performs digital filter processing and digital correction processing for a digital signal from the A/D conversion circuit 82.

Figure 19:
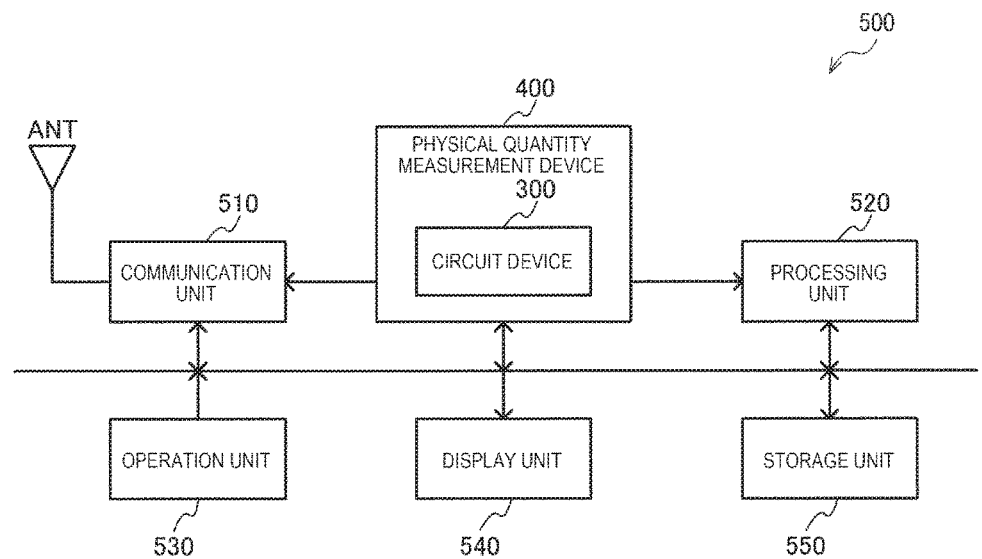
FIG. 19 illustrates a configuration example of an electronic apparatus including the circuit device.

FIG. 19 illustrates a configuration example of an electronic apparatus 500 including the circuit device 300. The electronic apparatus 500 includes the physical quantity measurement device 400 including the circuit device 300, and a processing unit 520. In addition, the electronic apparatus can include a communication unit 510, an operation unit 530, a display unit 540, a storage unit 550, and an antenna ANT.

Various apparatuses can be used as the electronic apparatus 500. For example, a wearable apparatus such as a GPS built-in timepiece, a biological information measurement apparatus or a head-mounted display device can be used. The biological information measurement apparatus is, for example, a pulse wave meter, a pedometer, or the like. Alternatively, a portable information terminal such as a smartphone, a mobile phone, a portable game device, a notebook PC or a tablet PC can be used. Alternatively, a content providing terminal that distributes contents, a video apparatus such as a digital camera or a video camera, or a network-related apparatus such as a base station or a router can be used. Alternatively, a measurement apparatus that measures physical quantities such as a distance, time, a flow speed or a flow quantity, an in-vehicle apparatus, a robot, or the like can be used. The in-vehicle apparatus is, for example, an apparatus for automatic drive.

The communication unit 510 is a radio circuit, and performs processing of receiving data from an external device and transmitting data to the external device via the antenna ANT. The processing unit 520 performs control processing of the electronic apparatus 500 and various digital processing of data transmitted and received via the communication unit 510. A function of the processing unit 520 can be realized by a processor such as a microcontroller. The operation unit 530 is a device for a user to perform an input operation and can be realized by operation buttons, a touch panel display, or the like. The display unit 540 displays various kinds of information and can be realized by a display such as liquid crystal or an organic EL. The storage unit 550 stores data, and a function thereof can be realized by a semiconductor memory such as a RAM or a ROM, a hard disk drive (HDD), or the like.

Figure 20:
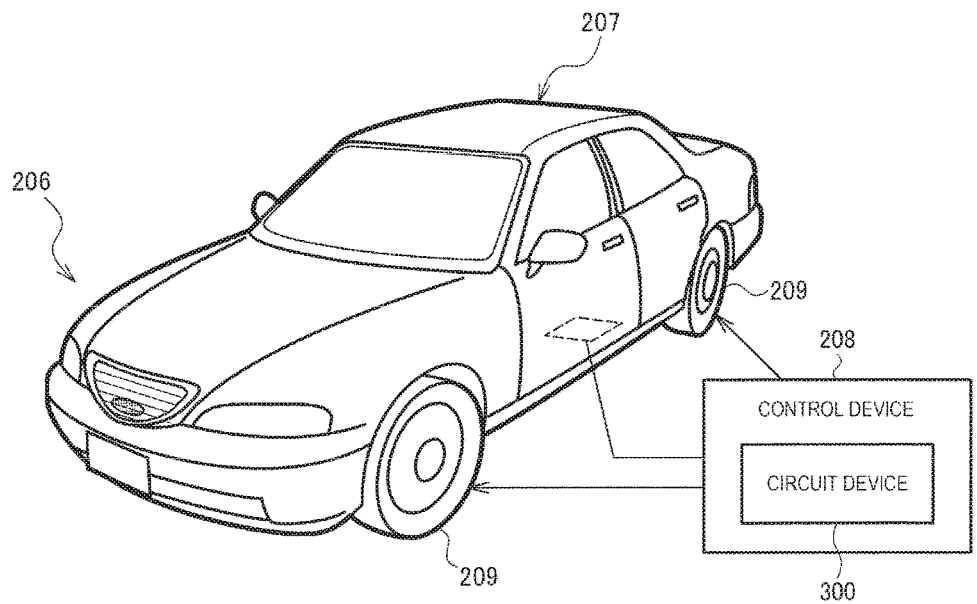
FIG. 20 illustrates an example of a vehicle including the circuit device.

FIG. 20 illustrates an example of a vehicle including the circuit device 300. The circuit device 300 can be incorporated into various vehicles such as a car, an airplane, a motorcycle, a bicycle, a robot, a ship, and the like. The vehicle is an apparatus or a device that includes a drive mechanism such as an engine and a motor, a steering mechanism such as a steering wheel and a rudder, and various in-vehicle electronic apparatuses and moves on the ground, the sky, or the sea. FIG. 20 schematically illustrates an automobile 206 as a specific example of the vehicle. A physical quantity measurement device including the circuit device 300 is incorporated in the automobile 206. A control device 208 performs various control processing, based on a physical quantity measured by the physical quantity measurement device. For example, in a case where the physical quantity measurement device is a gyro sensor, the gyro sensor can detect a posture of a vehicle body 207. A detection signal of the gyro sensor is supplied to the control device 208. The control device 208 can control, for example, hardness of a suspension according to the posture of the vehicle body 207 or brakes of separate wheels 209. An apparatus in which the circuit device 300 is incorporated is not limited to the control device 208 and can be incorporated into various apparatuses provided in a vehicle such as the automobile 206 or a robot.

Although the present embodiments are described in detail as described above, it will be easily understood by those skilled in the art that various modifications can be made which do not deviate practically from novel matters and effects of the invention. Accordingly, all the modifications are included in the scope of the invention. For example, in the specification or the drawings, a term described together with a different term which is broader or equivalent at least once can be replaced with the different term at any point in the specification or the drawings. In addition, all combinations of the present embodiments and the modifications are included in the scope of the invention. In addition, configurations and operations of the circuit device, the physical quantity measurement device, the electronic apparatus, and the vehicle are not limited to the configurations and operations described in the present embodiments, and various modifications can be made.

What is claimed is:

1. A circuit device comprising:
a detection signal terminal to which a detection signal from a vibrator is input;
a digital signal terminal that performs at least one of an input and an output of a digital signal;
a signal generation circuit that generates, based on the digital signal, a noise reduction signal for reducing noise of the detection signal; and
a detection circuit which includes:
an amplification circuit which amplifies the detection signal and performs additional processing of a signal which is obtained by amplifying the detection signal, and the noise reduction signal; and
a synchronization detection circuit which performs detection processing for an output signal of the amplification circuit, and
the detection circuit detects a physical quantity signal based on an output signal of the synchronization detection circuit,
wherein the amplification circuit includes:
a first amplifier circuit that amplifies the detection signal and outputs the amplified detection signal as a first output signal; and
a second amplifier circuit that amplifies the first output signal and adds the noise reduction signal,
wherein the detection signal includes a first detection signal and a second detection signal,
wherein the first amplifier circuit amplifies the first detection signal and the second detection signal and outputs a first signal and a second signal having a differential signal relationship as the first output signal,
wherein the second amplifier circuit amplifies the first output signal and adds the noise reduction signal to one of the first signal and the second signal, and
wherein the second amplifier circuit includes:
an operational amplifier;

a first input capacitor that is provided between a node to which the first signal is input and a first input node of the operational amplifier;

a first feedback capacitor that is provided between the first input node and a first output node of the operational amplifier;

a second input capacitor that is provided between a node to which the second signal is input and a second input node of the operational amplifier;

a second feedback capacitor that is provided between the second input node and a second output node of the operational amplifier; and a capacitor circuit that is provided between a node to which the noise reduction signal is input, and the first input node or the second input node.

2. The circuit device according to claim 1, wherein the capacitor circuit is a variable capacitance circuit whose capacitance value is variable.

3. The circuit device according to claim 1, wherein the capacitor circuit includes:

a first capacitor and a first capacitor connection switch that are provided in series between the node to which the noise reduction signal is input and the first node; node; and a second capacitor and a second capacitor connection switch that are provided in series between the node to which the noise reduction signal is input and the second input node.

4. A physical quantity measurement device comprising:
the circuit device according to claim 1; and
the vibrator.

5. An electronic apparatus comprising:
the circuit device according to claim 1.

6. A vehicle comprising:
the circuit device according to claim 1.

7. A circuit device comprising:

a detection signal terminal to which a detection signal from a vibrator is input;

a digital signal terminal that performs at least one of an input and an output of a digital signal;

a signal generation circuit that generates, based on the digital signal a noise reduction signal for reducing noise of the detection signal; and a detection circuit which includes:

an amplification circuit which amplifies the detection signal and performs additional processing of a signal which is obtained by amplifying the detection signal, and the noise reduction signal; and a synchronization detection circuit which performs detection processing for an output signal of the amplification circuit, and the detection circuit detects a physical quantity signal based on an output signal of the synchronization detection circuit, wherein the signal generation circuit includes an attenuation circuit that attenuates a signal level of the digital signal and outputs the attenuated signal as the noise reduction signal, wherein the attenuation circuit includes:

a first switch that is provided between a first node to which a power supply voltage is input and a second node;

a variable capacitance circuit that is provided between the second node and a ground node;

a second switch that is provided between the second node and a third node from which the noise reduction signal is output;

a capacitor that is provided between the third node and the ground node; and a third switch that is provided between the third node and the ground node, and wherein, when the digital signal is at a first logic level, the first switch and the third switch are turned on and the second switch is turned off, and when the digital signal is at a second logic level, the first switch and the third switch are turned off and the second switch is turned on.

8. The circuit device according to claim 7, wherein the attenuation circuit is a resistance circuit in which a signal level of the digital signal is divided by a resistance voltage division and a voltage division ratio of the resistance voltage division is variable.

9. The circuit device according to claim 7, wherein the signal generation circuit includes a buffer circuit that buffers the digital signal and outputs the buffered digital signal to the attenuation circuit, and wherein the buffer circuit can switch between a first mode for outputting an inverted signal of the digital signal and a second mode for outputting a non-inverted signal of the digital signal.

10. A circuit device comprising:

a detection signal terminal to which a detection signal from a vibrator is input;

first to kth communication signal terminals that perform at least one of an input and an output of first to kth communication signals, k being an integer greater than or equal to 2;

an interface circuit that performs interface processing, based on the first to kth communication signals;

a signal generation circuit that generates, based on the first to kth communication signals, a noise reduction signal for reducing noise of the detection signal; and a detection circuit which includes:

an amplification circuit which amplifies the detection signal and performs addition processing of a signal which is obtained by amplifying the detection signal, and the noise reduction signal; and a synchronization detection circuit which performs detection processing for an output signal of the amplification circuit, and the detection circuit detects a physical quantity signal based on an output signal of the synchronization detection circuit, wherein the signal generation circuit includes an attenuation circuit that attenuates a signal level of the digital signal and outputs the attenuated signal as the noise reduction signal, wherein the attenuation circuit includes:

a first switch that is provided between a first node to which a power supply voltage is input and a second node;

a variable capacitance circuit that is provided between the second node and a ground node;

a second switch that is provided between the second node and a third node from which the noise reduction signal is output;

a capacitor that is provided between the third node and the ground node; and a third switch that is provided between the third node and the ground node, and wherein, when the digital signal is at a first logic level, the first switch and the third switch are turned on and the second switch is turned off, and when the digital signal is at a second logic level, the first switch and the third switch are turned off and the second switch is turned on.

11. The circuit device according to claim 10, wherein the detection circuit includes
a low pass filter that performs low pass filter processing of an output signal of the synchronization detection circuit, and
an A/D conversion circuit that performs an A/D conversion of an output signal of the low pass filter, and
wherein the interface circuit outputs physical quantity data based on A/D conversion data of the A/D conversion circuit during the interface processing.

* * * * *